United States Patent
Kamali et al.

(10) Patent No.: US 11,450,970 B2
(45) Date of Patent: Sep. 20, 2022

(54) METASURFACE-ASSISTED 3D BEAM SHAPING FOR DESIRED PHASE, AMPLITUDE, AND POLARIZATION

(71) Applicant: CALIFORNIA INSTITUTE OF TECHNOLOGY, Pasadena, CA (US)

(72) Inventors: Seyedeh Mahsa Kamali, Arcadia, CA (US); Ehsan Arbabi, Arcadia, CA (US); Andrei Faraon, La Canada Flintridge, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 785 days.

(21) Appl. No.: 16/209,788

(22) Filed: Dec. 4, 2018

(65) Prior Publication Data
US 2019/0173191 A1 Jun. 6, 2019

Related U.S. Application Data

(60) Provisional application No. 62/594,113, filed on Dec. 4, 2017.

(51) Int. Cl.
*H01Q 1/42* (2006.01)
*H01Q 15/24* (2006.01)
(Continued)

(52) U.S. Cl.
CPC ....... *H01Q 15/242* (2013.01); *G02B 27/0944* (2013.01); *G02B 27/44* (2013.01);
(Continued)

(58) Field of Classification Search
CPC ............... G02B 1/002; G02B 27/0012; G02B 27/0927; G02B 27/0938; G02B 27/0944;
(Continued)

(56) References Cited

U.S. PATENT DOCUMENTS

| 6,754,006 B2 | 6/2004 | Barton et al. |
| 7,687,132 B1 | 3/2010 | Gross et al. |

(Continued)

FOREIGN PATENT DOCUMENTS

| DE | 10341596 A1 | 4/2005 |
| EP | 3226042 A1 | 10/2017 |

(Continued)

OTHER PUBLICATIONS

Arbabi, Amir, et al. "Dielectric metasurfaces for complete control of phase and polarization with subwavelength spatial resolution and high transmission." Nature nanotechnology 10.11 (Nov. 2015): 937-943. Total of 8 pages.

(Continued)

*Primary Examiner* — Ryan S Dunning
(74) *Attorney, Agent, or Firm* — Steinfl + Bruno LLP

(57) ABSTRACT

Cascaded metasurfaces can control the phase, amplitude and polarization of an electromagnetic beam, shaping it in three dimensional configuration not achievable with other methods. Each cascaded metasurface has dielectric or metallic scatterers arranged in a period array. The shape of the scatterers determines the three dimensional configuration of the output beam and is determined with iterative calculations through computational simulations.

9 Claims, 28 Drawing Sheets

(51) Int. Cl.
G02B 27/09 (2006.01)
G02B 27/44 (2006.01)
G03F 7/20 (2006.01)
G02F 1/00 (2006.01)
G02B 5/30 (2006.01)
G02B 1/00 (2006.01)
G02B 27/00 (2006.01)

(52) U.S. Cl.
CPC ............ G02F 1/00 (2013.01); G03F 7/70408 (2013.01); H01Q 1/422 (2013.01); H01Q 1/425 (2013.01); *G02B 1/002* (2013.01); *G02B 5/3083* (2013.01); *G02B 27/0012* (2013.01)

(58) Field of Classification Search
CPC ............ G02B 27/0977; G02B 27/0988; G02B 27/4205; G02B 27/4233; G02B 27/4261; G02B 27/4266; G02B 27/4272; G02B 27/44; H01Q 1/422; H01Q 1/425; H01Q 15/242
See application file for complete search history.

(56) References Cited

U.S. PATENT DOCUMENTS

| | | | |
|---|---|---|---|
| 10,423,045 B2* | 9/2019 | Roberts | G02F 1/29 |
| 2003/0067687 A1 | 4/2003 | Barton et al. | |
| 2006/0118837 A1 | 6/2006 | Choi | |
| 2012/0013989 A1 | 1/2012 | Choi et al. | |
| 2015/0029588 A1 | 1/2015 | Fiorentino et al. | |
| 2015/0198812 A1 | 7/2015 | Gaylord et al. | |
| 2015/0309473 A1 | 10/2015 | Spadaccini et al. | |
| 2016/0077261 A1* | 3/2016 | Arbabi | G02B 5/0278 |
| | | | 359/493.01 |
| 2017/0188901 A1 | 7/2017 | Faraon et al. | |
| 2017/0212285 A1 | 7/2017 | Arbabi et al. | |

FOREIGN PATENT DOCUMENTS

| | | |
|---|---|---|
| WO | 2012/007147 A1 | 1/2012 |
| WO | 2013/085535 A1 | 6/2013 |

OTHER PUBLICATIONS

Arbabi, E., et al. "Multiwavelength polarization-insensitive lenses based on dielectric metasurfaces with meta-molecules". Optica vol. 3, No. 6, 628-633, (Jun. 2016). 6 pages.
Chen, B-C., et al. "Lattice Light Sheet Microscopy: Imaging Molecules to Embryos at High Spatiotemporal Resolution". Science vol. 346, Issue 6208, 1257998, (Oct. 2014). 28 pages.
Kamali, S. M., et al. "Angle-multiplexed metasurfaces: encoding independent wavefronts in a single metasurface under different illumination angles". Physical Review X,vol. 7, Iss. 4, 041056 (Dec. 2017). 9 pages.
Kamali, S. M., et al. "Decoupling optical function and geometrical form using conformal flexible dielectric metasurfaces." *Nature communications*7 , 11618, (May 2016). 7 pages.
Meza, L. R., et al. "Strong, lightweight, and recoverable three-dimensional ceramic nanolattices", Science vol. 345, Iss. 6202, 1322-1326, (Sep. 2014). 6 pages.
Rizvi, Nadeem H. "Femtosecond laser micromachining: Current status and applications." Riken review (2003): 107-112. Total of 10 pages.
Rodrigo, J. A., et al. "Shaping of light beams along curves in three dimensions", Optics Express vol. 21, No. 18, 20544-20555, (Sep. 2013). 12 pages.
Schaedler, T. A., et al. "Ultralight metallic microlattices", Science vol. 334, Iss. 6058, 962-965, (Nov. 2011). 5 pages.
Tumbleston, J. R., et al. "Continuous liquid interface production of 3D objects", Science vol. 347, Iss. 6228, 1349-1352, (Mar. 2015). 5 pages.
International Search Report for PCT/US2018/063903 filed Dec. 4, 2018 on behalf of California Institute of Technology, dated Mar. 21, 2019. 5 pages.
Written Opinion for PCT/US2018/063903 filed Dec. 4, 2018 on behalf of California Institute of Technology, dated Mar. 21, 2019. 6 pages.
Colburn, S., et al., "Tunable metasurfaces via subwavelength phase shifters with uniform amplitude," Scientific Reports, vol. 7, Jan. 5, 2017. p. 40174, XP055348008, DOI: 10.1038/srep40174. 9 Pages.
Kim, H., et al., "Study on phase and amplitude modulation of a two-dimensional subwavelength diffractive element on artificial distributed-index medium", Proceedings of the SPIE, vol. 4929, Sep. 16, 2002, pp. 334-341, XP002803645, 9 pages.
Partial Supplementary European Search Report issued for EP Application No. 18886721.2 filed on Jun. 10, 2020, on behalf of California Institute of Technology, dated Jul. 26, 2021. 12 Pages.
Pertsch, T., et al., "Diffractive optical elements made from photonic metamaterials," Proceedings of SPIE, IEEE, US, vol. 9626, Sep. 23, 2015, pp. 962604-962604,XP060061082, DOI: 10.1117/12. 2195726 ISBN: 978-1-62841-730-2. 16 Pages.
EPO Second Search Report issued for EP Application No. 18886721.2 filed on Jun. 10, 2020, on behalf of California Institute of Technology, dated Dec. 3, 2021. 14 Pages.
Guo et al., "Multipolar Coupling in Hybrid Metal-Dielectric Metasurfaces," ACS Photonics, vol. 3, issue 3. Mar. 2, 2016. pp. 349-353.
First examination report + Search Report Issued for Indian Patent Application No. 202017025335 filed on Jun. 16, 2020, behalf of California Institute of Technology. Date of Dispatch: Jun. 15, 2022. Original Hindi and English. 8 Pages.

* cited by examiner

US 11,450,970 B2

METASURFACE-ASSISTED 3D BEAM SHAPING FOR DESIRED PHASE, AMPLITUDE, AND POLARIZATION

CROSS REFERENCE TO RELATED APPLICATIONS

The present application claims priority to U.S. Provisional Patent Application No. 62/594,113, filed on Dec. 4, 2017, the disclosure of which is incorporated herein by reference in its entirety.

STATEMENT OF INTEREST

This invention was made with government support under Grant No. DE-SC0001293 awarded by the Department of Energy and under Grant No. CBET1512266 awarded by the National Science Foundation. The government has certain rights in the invention.

TECHNICAL FIELD

The present disclosure relates to metasurfaces. More particularly, it relates to metasurface-assisted 3D beam shaping and interference lithography.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

SUMMARY

Figure 1:
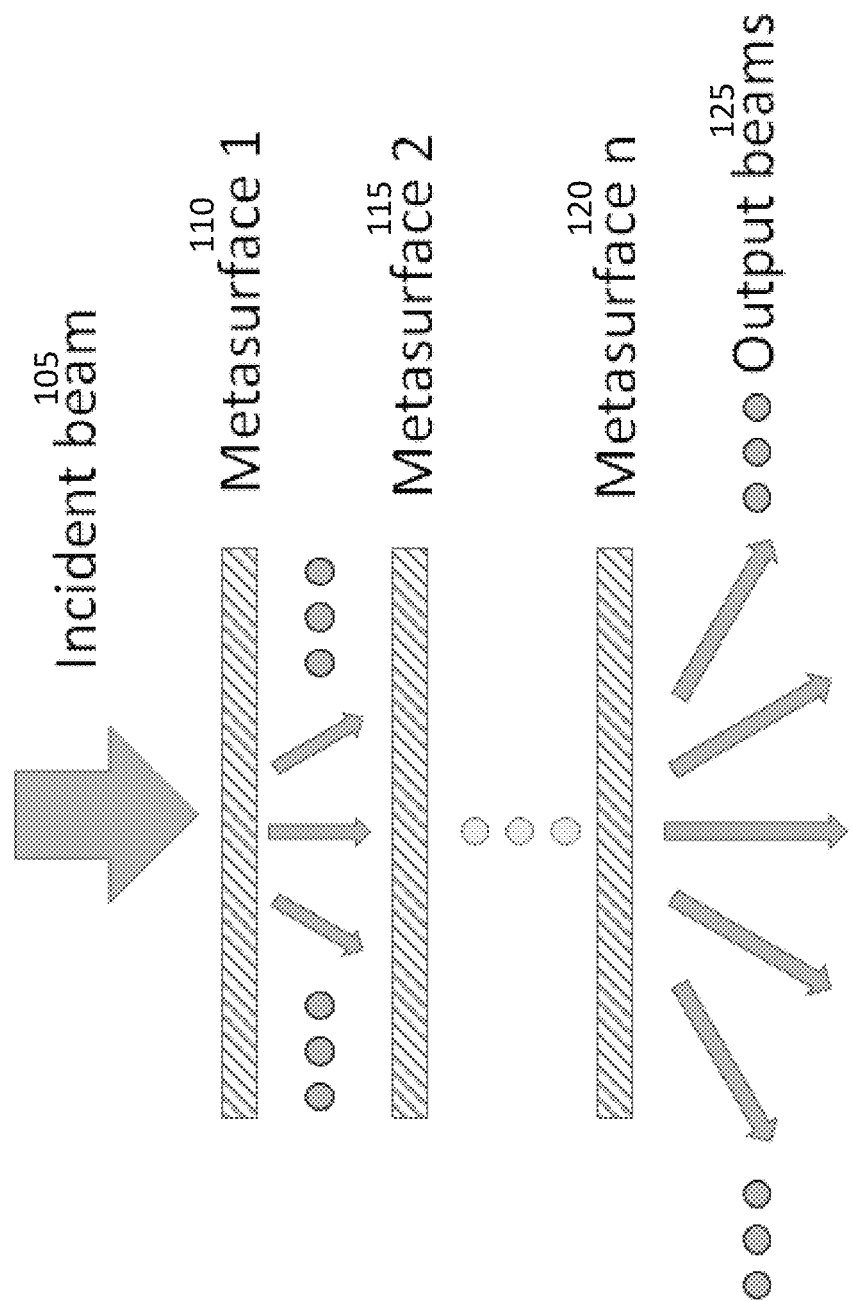
FIG. 1 illustrates beam shaping by multiple cascaded metasurfaces.

In a first aspect of the disclosure, a structure is described, the structure comprising: one or more metasurfaces, each metasurface of the one or more metasurfaces comprising an array of scatterers on a substrate, the array of scatterers configured to control a phase, an amplitude, and a polarization of scattered electromagnetic waves; wherein: the array of scatterers of each metasurface of the one or more metasurfaces comprises metallic scatterers or dielectric scatterers, and the array of scatterers of each metasurface of the one or more metasurfaces has a parametric shape determined by a plurality of dimensional parameters.

In a second aspect of the disclosure, a method is described, the method comprising: selecting a desired three dimensional (3D) shape of an electromagnetic beam, comprising a desired phase, a desired amplitude, and a desired polarization; selecting a parametric shape for an array of scatterers for each metasurface of one or more metasurfaces; calculating, by a computer, a simulated 3D shape of a simulated electromagnetic beam scattered by the one or more metasurfaces; calculating a difference between the desired 3D shape and the simulated 3D shape; iterating steps b)-d) until a threshold minimum value for the difference is achieved; and fabricating the one or more metasurfaces based on the parametric shape, once the threshold minimum value for the difference is achieved.

DETAILED DESCRIPTION

The present disclosure describes volumetric (3D) beam shaping through metasurfaces. Shaping a beam intensity and phase in a three-dimensional (3D) volume is a problem with a wide variety of applications including imaging, optical trapping, laser micromachining, and 3D fabrication and photolithography. In 3D beam shaping, an input beam with a specified intensity and phase distribution across a plane is converted to an output beam with a different intensity and phase profile, after passing through (or being reflected off) a metasurface mask. Different iterative and non-iterative techniques and algorithms can be utilized in order to find the required intensity and phase profiles of the metasurface mask from the required 3D intensity (and/or phase) distribution in a volume. The present disclosure describes cascaded metasurfaces which improve upon previously demonstrated 3D beam shaping configurations by providing more degrees of freedom. In particular, the metasurfaces described herein provide simultaneous control of phase, amplitude, and polarization with subwavelength spatial resolution, in order to shape the polarization-dependent beam intensity and phase in a 3D volume. All the beam shaping techniques known to the person of ordinary skill in the art are based on controlling at most two of the three existing degrees of freedom, resulting in a limited control over the 3D intensity distribution. For example, known methods may control the phase and amplitude of the steered beam, or the phase and polarization, but not all three parameters simultaneously: phase, amplitude and polarization.

The present disclosure, by contrast, describes a metasurface platform with simultaneous control of amplitude, phase, and polarization for shaping the beam intensity and phase in 3D configurations in the wavelength scale as well as in the mesoscale. The metasurfaces of the present disclosure can shape the beam in new 3D configurations not feasible with the methods known in the art. The metasurfaces of the present disclosure can be designed to operate at different wavelengths and/or angles, either at a single wavelength or angle, or simultaneously at multiple wavelengths or angles, in order to increase the total degrees of freedom and shape a beam into new 3D configurations. Although the metasurfaces are fabricated in a rigid planar substrate, they can be easily transferred to flexible and stretchable substrates in order to increase the projection angle of the incident light, or to create new 3D beam configurations not possible with a planar mask.

A schematic illustration of the metasurfaces of the present disclosure is illustrated in FIG. 1. The device is composed of a single metasurface, or multiple cascaded metasurfaces (110,115,120), with simultaneous control of phase, polarization, and/or amplitude for the output beams (125). FIG. 1 illustrates the incident beam (105) transmitted through the metasurfaces, however the device may also be fabricated for reflection. The number of cascaded metasurfaces (110,115, 120) is determined according to the application and complexity of the final 3D beam configuration. Each metasurface can be designed for operation under one or more specific illumination wavelengths and/or angles. Metasurfaces are composed of arrays of dielectric or metallic scatterers that can manipulate the polarization, phase and/or amplitude of the scattered wavefront. Different materials can be used for the metasurface fabrication, to shape beams with different wavelengths according to the specific application, including but not limited to silicon, gallium phosphide, silicon nitride, and titanium dioxide in their various amorphous or crystalline forms, as well as various types of metals. The scatterers can have any cross-sectional shape, including but not limited to rectangular, elliptical, diamond, trigonal, and even free-form shapes defined through parametric functions whose shape is determined via a finite set of parameters. The rectangular and elliptical shape examples can be assumed as special cases of these parametric functions, where the defining parameters of the shape are the two side lengths of the rectangle, or the major axis and minor axis of the ellipse. The design process of the parametric shapes is in principle similar to the methods explained in in the present disclosure for dielectric and metallic scatterers that control phase and amplitude. In the process, the transmission phase and/or amplitude of light transmitted through a periodic array of the scatterers, the scatterers defined by the parametric shape, is calculated from electromagnetic simulations of the structure. The values of the parameters are then tuned to minimize the difference between the desired and achieved transmission phase and/or amplitudes through the scatterers. The parameter values corresponding to the minimum difference between the desired and achieved transmissions are recorded as the parameters of the shape corresponding to that specific desired transmission phase and/or amplitude. The process is repeated for each required transmission phase and/or amplitude until there is a scatterer shape (i.e., corresponding parameter values) that provides that specific transmission phase and/or amplitude. When the polarization dependent phase/amplitude control is required, the shape requires at least two independent parameters (such as, for example, those of rectangles, ellipses, and diamonds).

Figure 19:
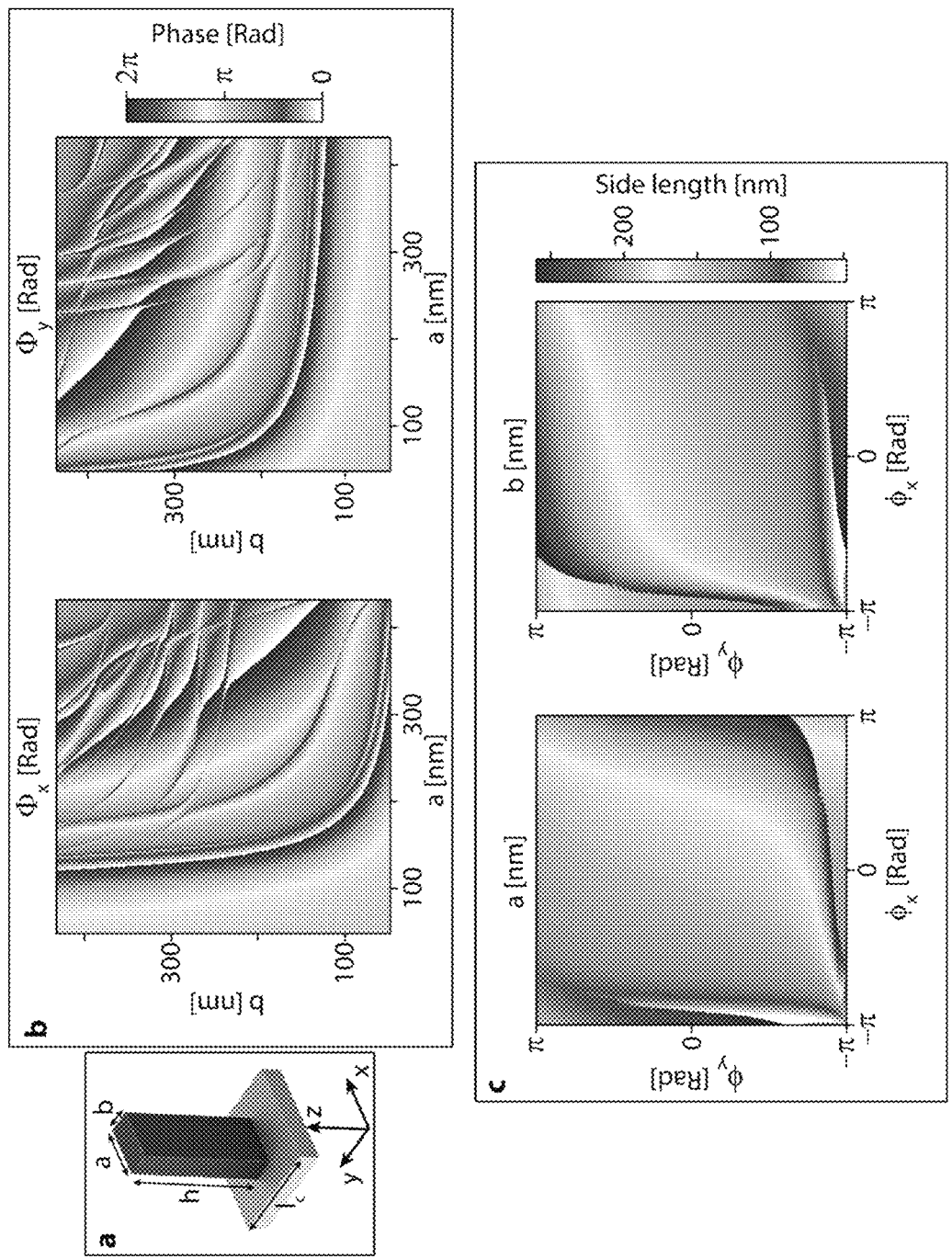
FIG. 19 shows an exemplary nano-posts structure for a metasurface, in addition to simulated transmission phases versus the side widths, and the chosen side widths to provide a desired phase pair for x- and y-polarized light.
Figure 28:
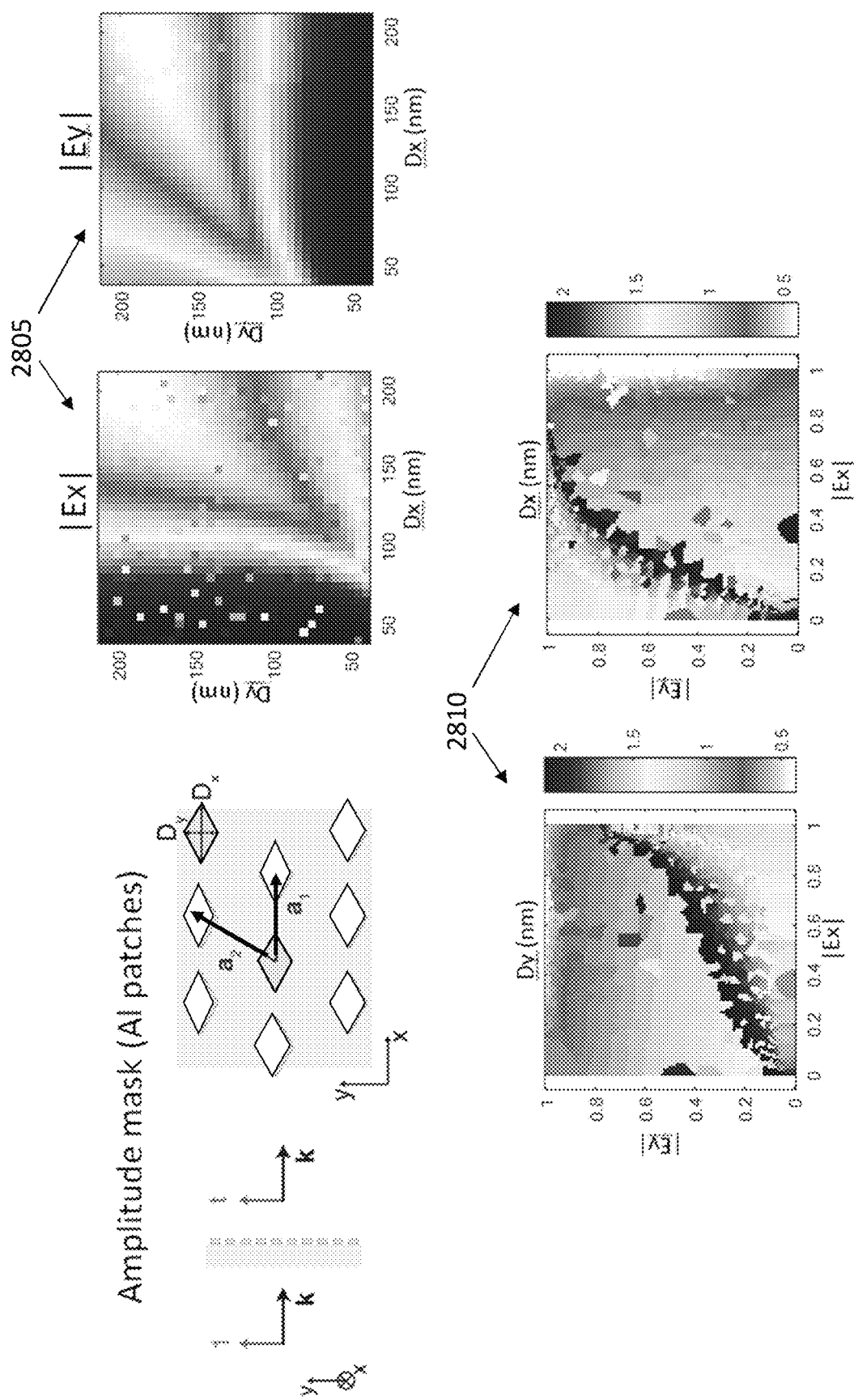
FIG. 28 illustrates the polarization dependent amplitude control using a single layer of a metallic metasurface.

Exemplary designs of dielectric rectangular shaped scatterers that provide polarization dependent phase control are shown in FIG. 19. Exemplary designs of metallic diamond shaped scatterers that provide polarization dependent amplitude control are shown in FIG. 28. When the two orthogonal polarizations of interest are linear (similar to the examples mentioned above), the scatterer shapes should possess two mirror symmetry axes along the two linear polarizations, in order to avoid coupling of the two polarization basis.

In FIG. 1, each metasurface can have simultaneous control of phase, polarization, and/or amplitude, or different metasurface layers can provide said control over different degrees of freedom. For instance, a dielectric metasurface layer can be used to provide independent phase control for two polarizations, and a following metallic metasurface can be used to provide amplitude control for the two polarizations (e.g. FIG. 19 for an example of phase control with a dielectric metasurface, and FIG. 28 for an example of amplitude control with a metallic metasurface). When cascaded, the two layers provide polarization-dependent control of phase and amplitude simultaneously. In general, the required level of control (i.e., which combination of phase, polarization, and amplitude need to be controlled) is determined via the specific beam shape. There is no direct way of calculating this required control from the shape, and therefore the process inevitably involves some form of inverse design step (i.e., an optimization process).

Figure 8:
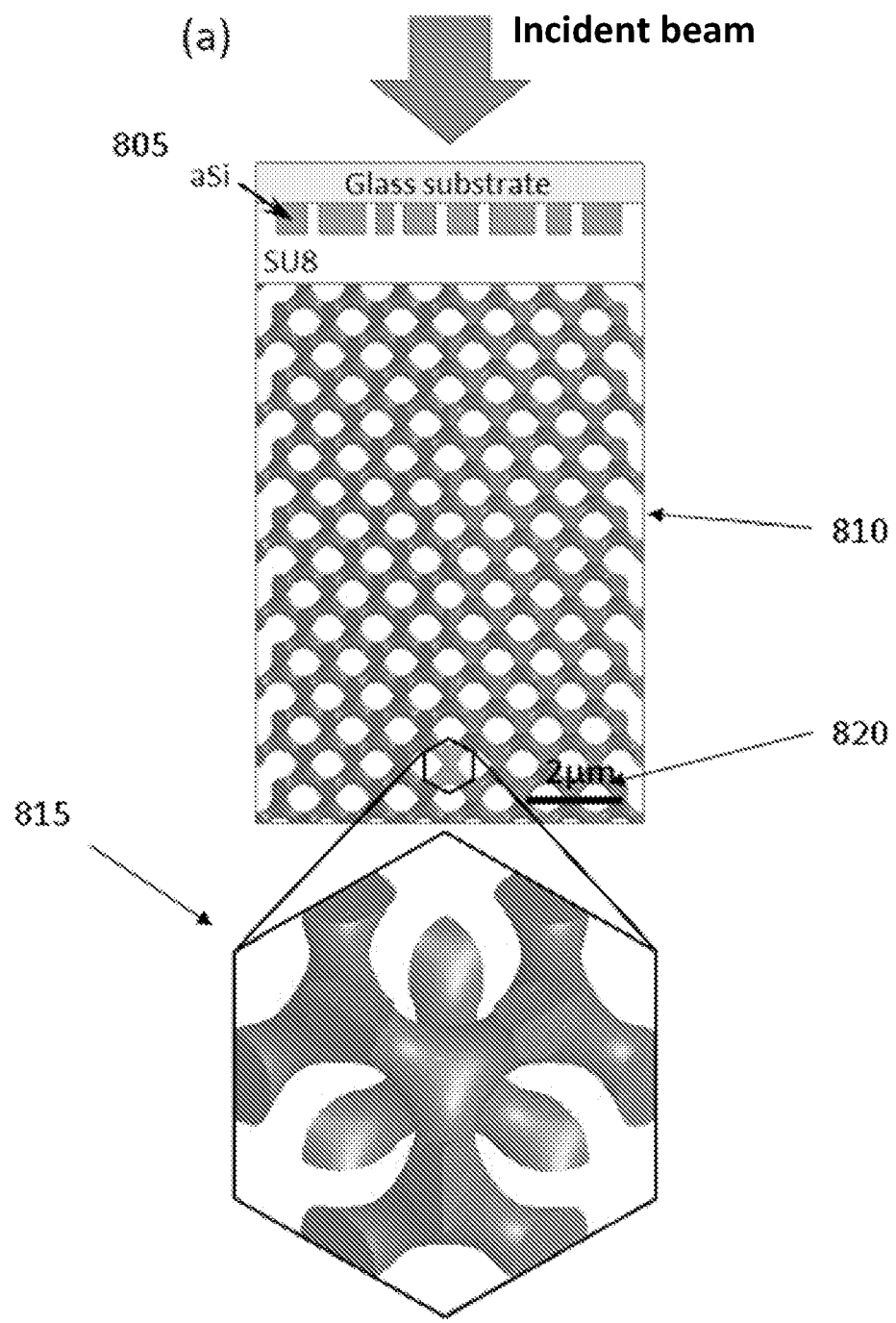
FIG. 8 illustrates a single layer metasurface device used as a mask to shape the beam to form an intensity distribution with a lattice structure.
Figure 9:
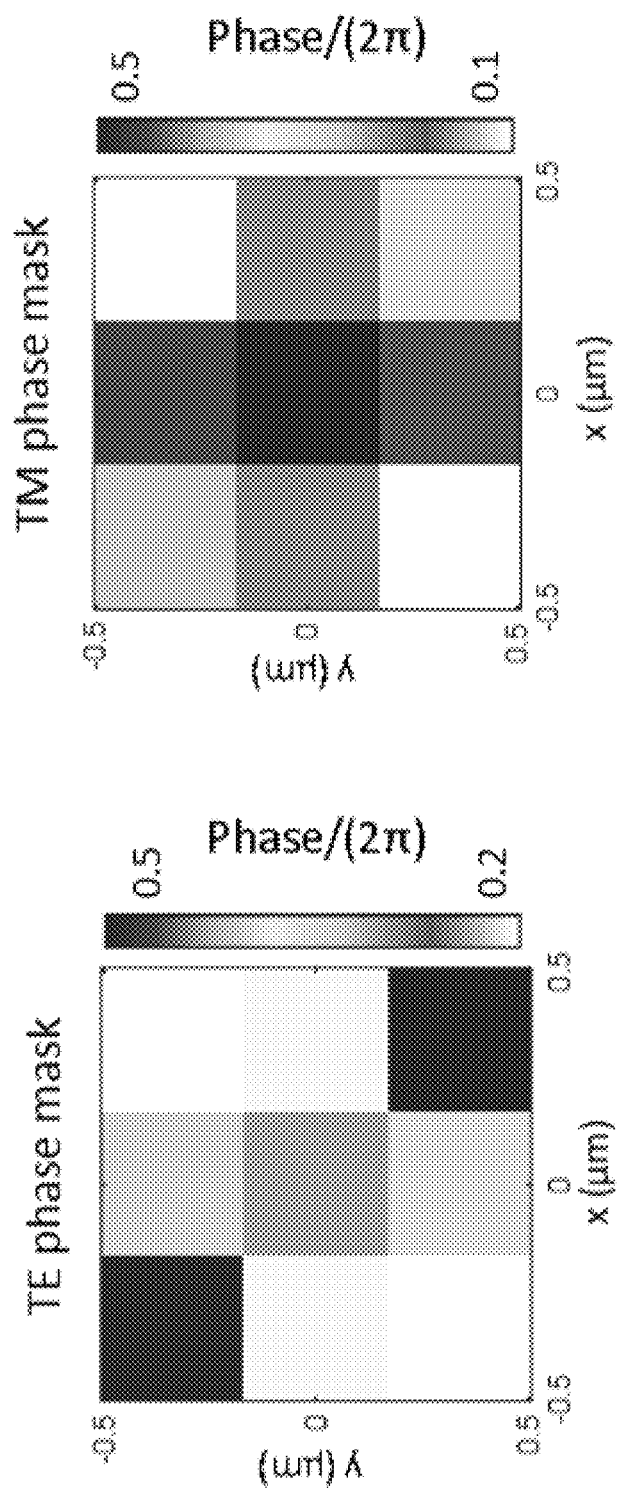
FIG. 9 illustrates the required phases of the TE and TM polarizations of light for the structure of FIG. 8.
Figure 10:
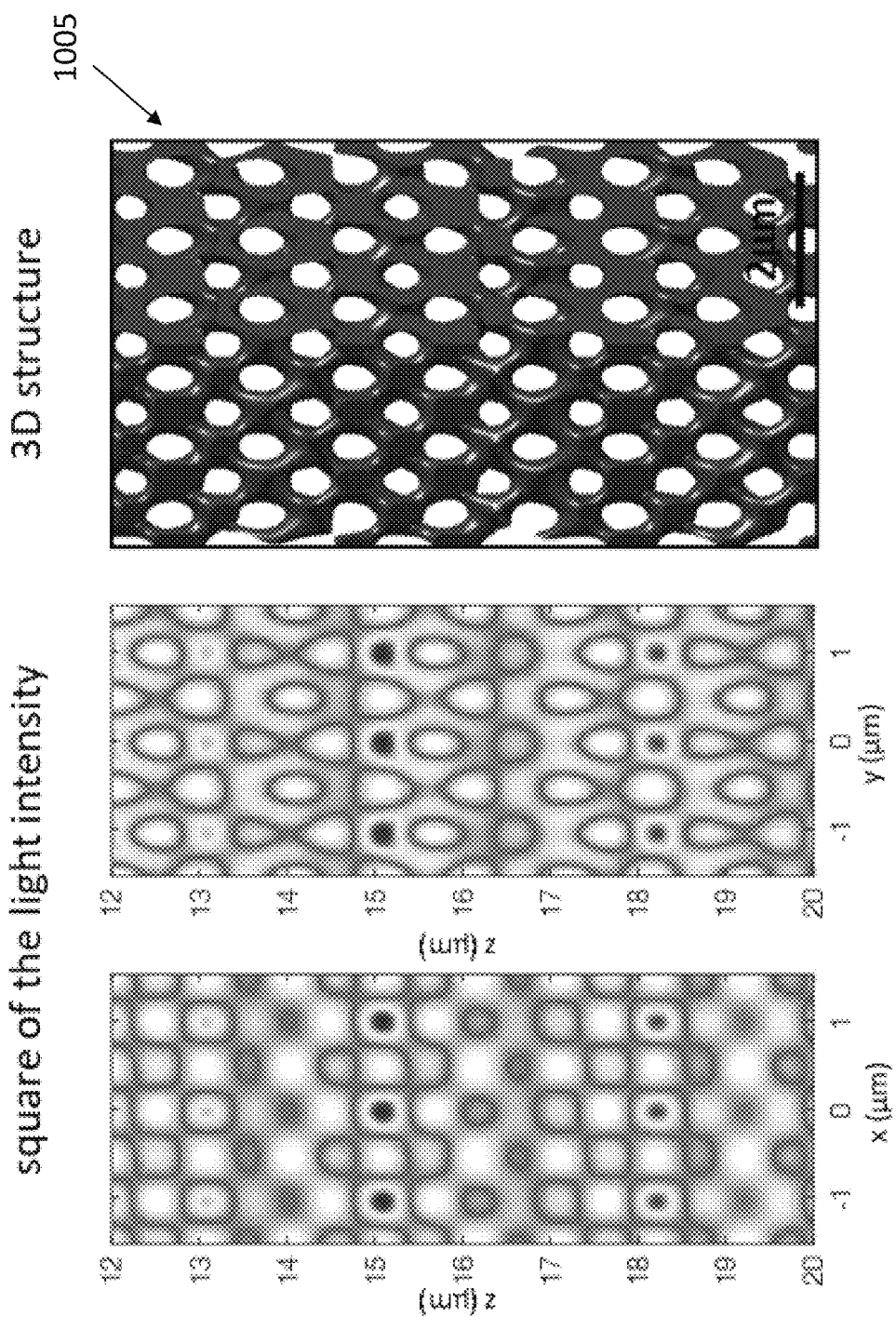
FIG. 10 illustrates the intensity of light generated by the structure of FIG. 8, along with the 3D structure formed in the photoresist by using this intensity pattern for photolithography.
Figure 11:
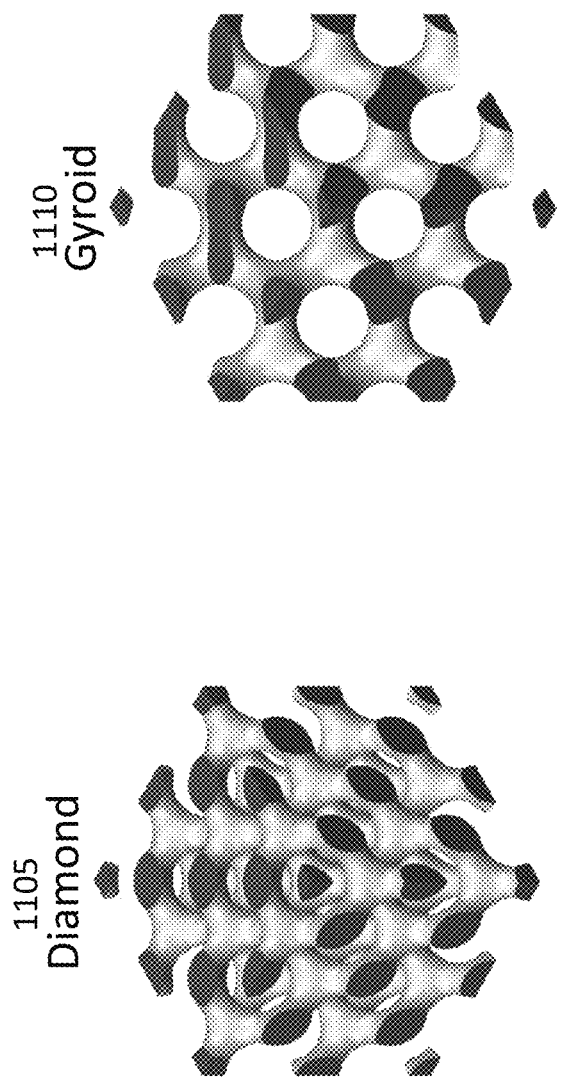
FIG. 11 illustrates two exemplary micron-scale periodic lattices (diamond and gyroid) that can be formed using single layer dielectric metasurfaces with the ability to control the phase independently for TE and TM polarizations.
Figure 13:
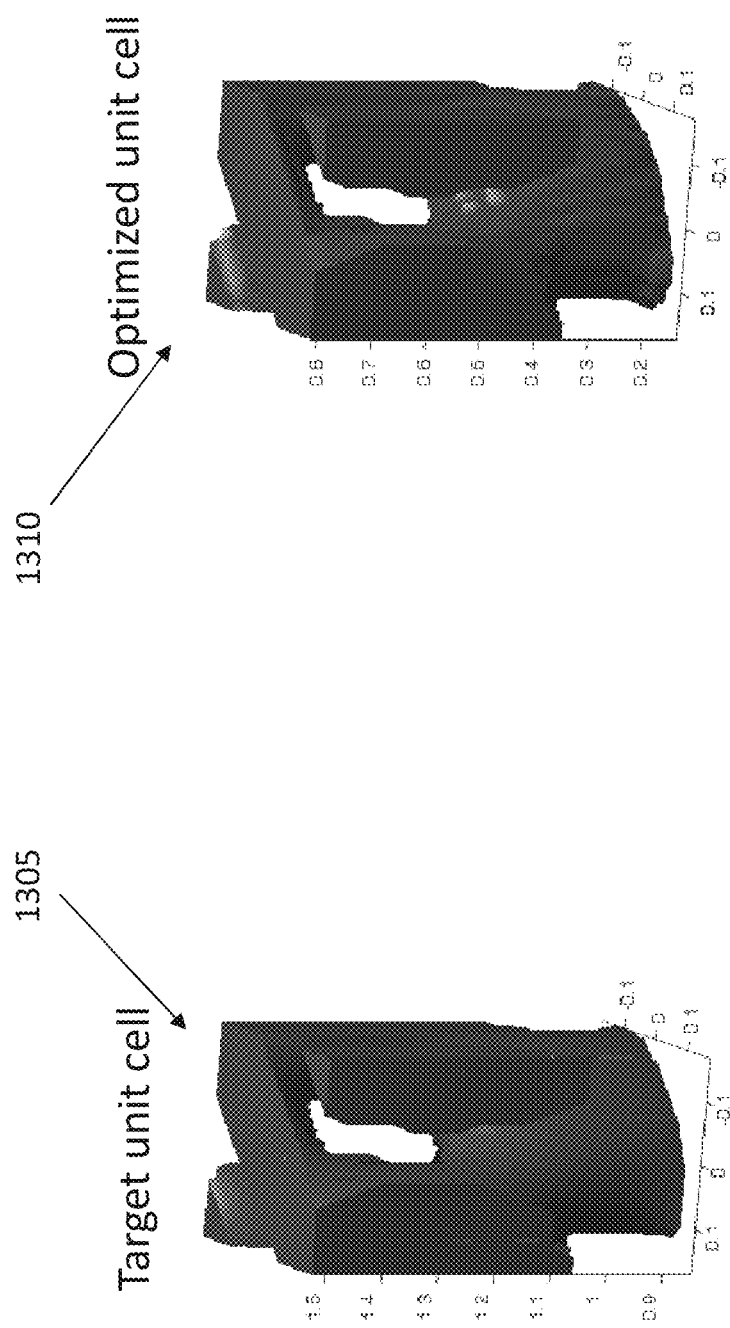
FIG. 13 illustrates the target binarized intensity distribution (1305) for an exemplary micron-scale periodic lattice.
Figure 16:
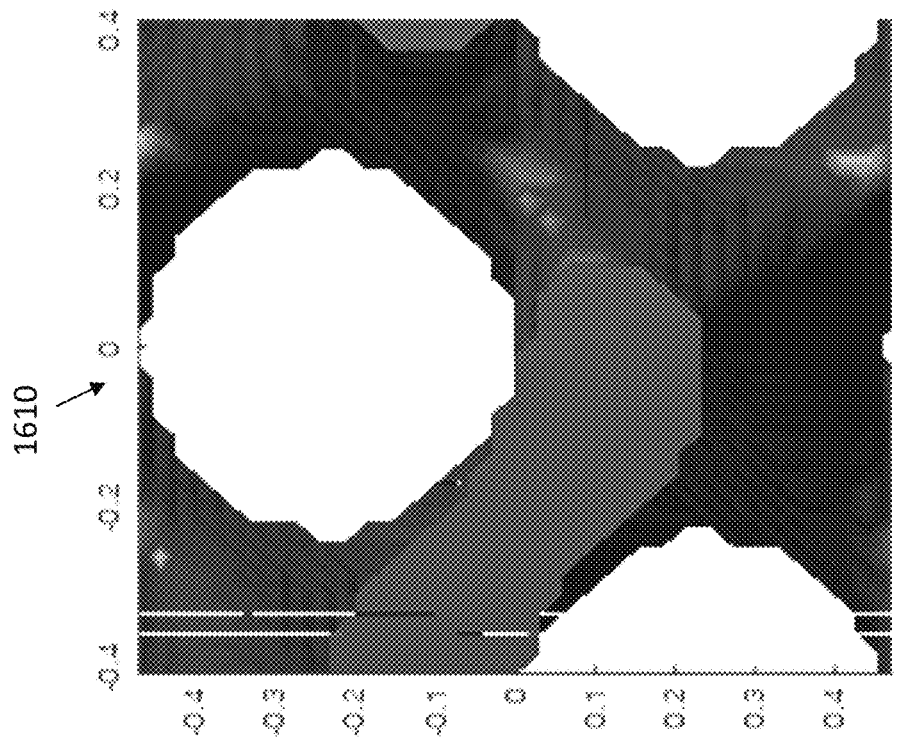
FIG. 16 illustrates side and top views of the unit cells of an example gyroid lattice structure that can be generated using a single layer metasurface with the ability to control the phase independently for TE and TM polarizations.
Figure 16:
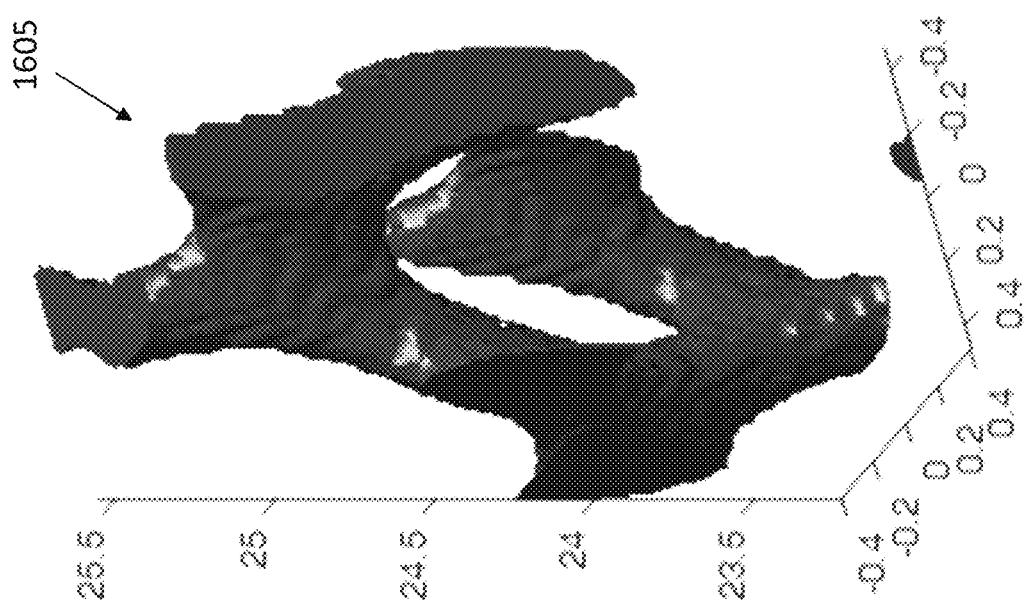

Two specific categories of shapes are of particular interest in various applications such as interference lithography. The first category of shapes comprises wavelength scale structures that are periodic with defined translation vectors. In these structures, the intensity is defined in a single unit cell, and is then periodically copied to form a Bravais lattice structure that matches the specific unit cell. In these structures, the normalized intensity is above a certain threshold (e.g., 0.5) over a volume with a finite cross-section around the vertices and sides of a Bravais lattice structure. Examples of such structures are shown in FIG. 8, where the unit cell of a diamond structure is repeated on a rectangular lattice, generating a face centered Bravais lattice. Other examples are shown in FIGS. 11, 13 and 16 (where the shown unit cells should be repeated on a rectangular lattice with translation vectors matching its dimensions), 24, and 26. A property of such structures is that the underlying Bravais lattice can be defined through three distinct vectors. In interference lithography, these vectors are formed by 4 interfering beams with different propagation directions. As a result, to form these wavelength-scale Bravais lattice structures it usually suffices to have control over the phase of light for two orthogonal polarizations in addition to the input light polarization (FIGS. 8-10). The required interfering beams (that can be 4 or more for additional control of the formed structure) can be generated using the diffraction orders of a metasurface that has the same periodicity as the Bravais lattice in the transverse plane (e.g., horizontal plane in FIGS. 8 and 10). The required control then translates to controlling the relative amplitudes and phases of the diffraction orders of the periodic metasurface structure. This control can usually be achieved using a single layer dielectric metasurface (FIG. 19).

The second category of structures are mesoscale structures defined through interconnected lines or curves, similar to the ones shown in FIGS. 2, 4, 5, and 6. Forming these mesoscale structures (e.g., the ones of FIGS. 2-7) usually requires a polarization dependent control of phase and amplitude. This level of control can be achieved using a double layer metasurface, similar to the ones shown in FIGS. 2, 5, and 27, where the dielectric metasurface layer enables polarization dependent phase control, and the metallic metasurface layer enabling polarization dependent amplitude control. The metasurfaces can also be designed for multiple angles or wavelengths depending on the application using any methods known to the person of ordinary skill in the field. Cascaded metasurfaces with more than two layers can also be utilized to enable phase, polarization, and amplitude control over multiple input wavelengths and/or angles. As illustrative examples, multiple different 3D beam shaping configurations in micro to mesoscale are examined through simulations in this disclosure to serve as examples of the disclosed platforms and concept. In particular, it is shown that different mesoscale and nano-scale 3D beam configurations that were not previously feasible can be easily shaped using the metasurfaces and methods of the present disclosure. The examples here are only intended to serve as potential examples and do not limit the scope of the invention to any shape or form or particular metasurface structure.

Figure 2:
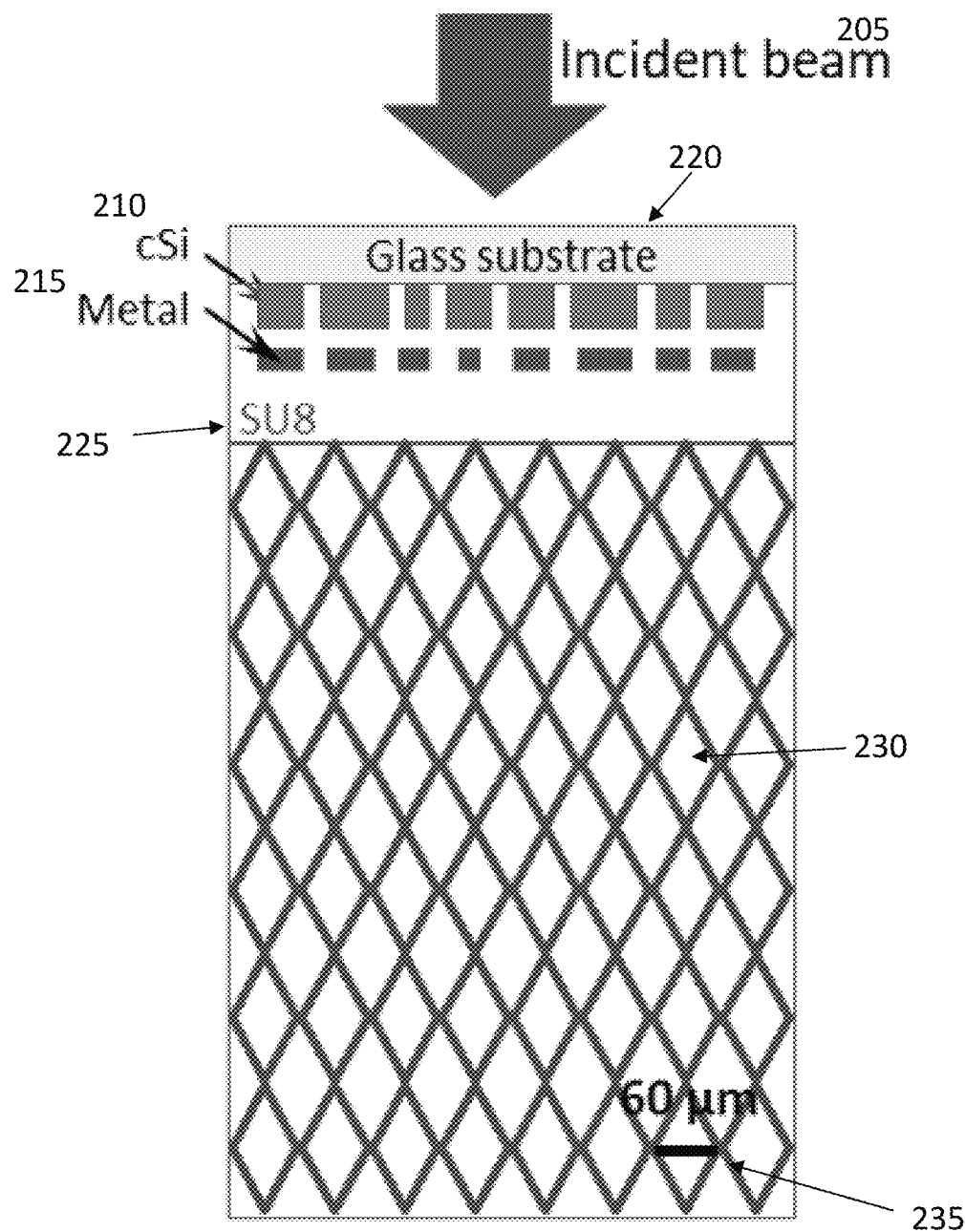
FIG. 2 illustrates a two layer metasurface device used as a mask to shape the beam at a wavelength of 532 nm.

FIG. 2 illustrates a two layer metasurface device used as a mask to shape the beam at a wavelength of 532 nm. The incident beam (205) is transmitted through the transparent glass substrate (220), scattered by the two metasurfaces (210,215), and is shaped in a configuration similar to a 3D micro-truss structure (230). The first metasurface, in this example is made of Si (210), while the second metasurface is made of a metallic material (215). The scale bar (235) is 60 micrometers. A SU8 polymer (225) provides mechanical integrity to the metasurface elements.

Figure 3:
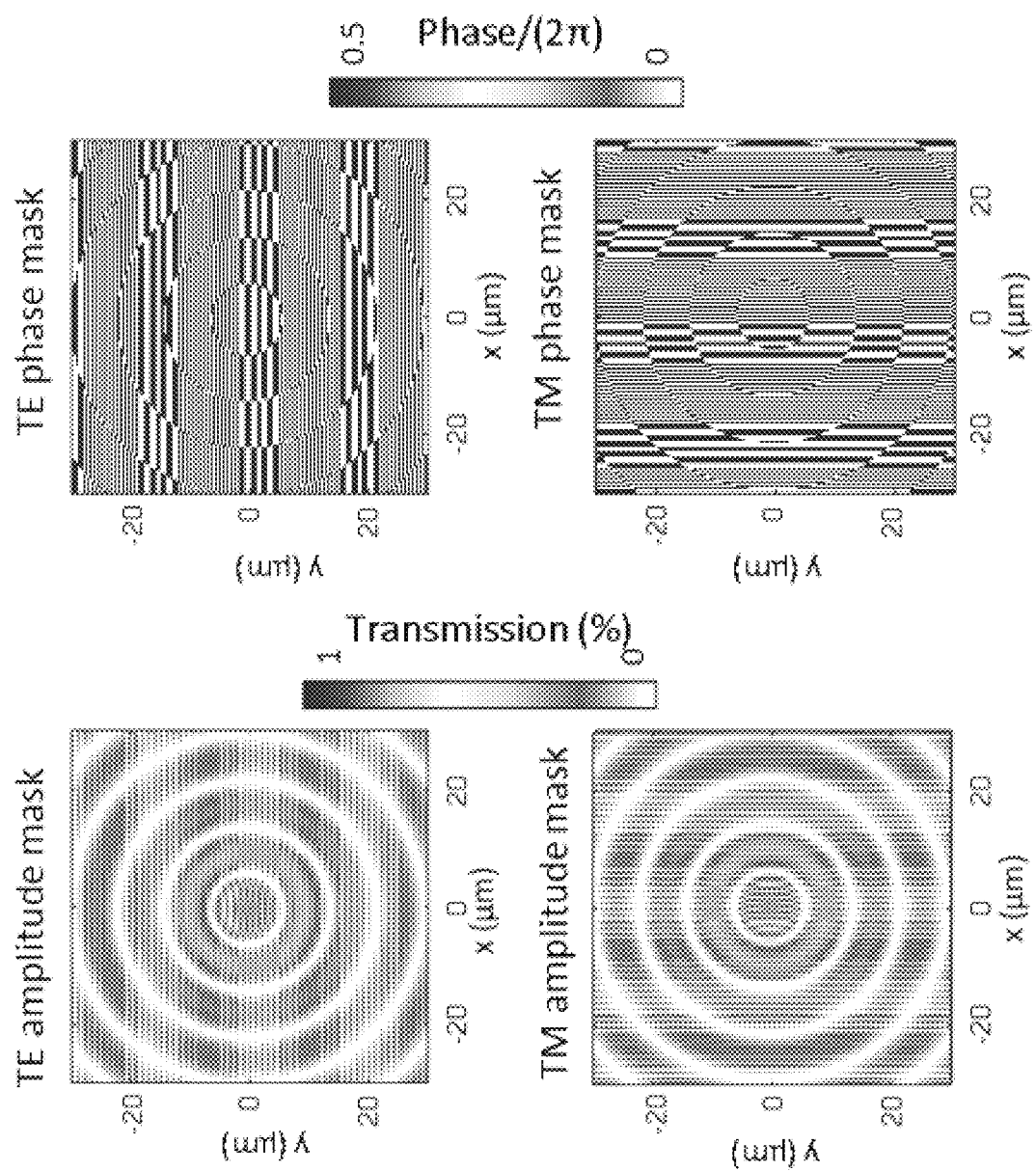
FIG. 3 illustrates the required amplitude and phase masks for TE and TM light polarizations for the structure of FIG. 2.

FIG. 3 illustrates the designed amplitude and phase masks for different orthogonal polarizations corresponding to the structure in FIG. 2. The two-layer metasurface of FIG. 2 is designed to implement the amplitude and phase masks for different polarizations. FIG. 3 illustrates phase and amplitude masks which are designed for two different polarizations (TE and TM polarizations) to shape the incident beam like a micro-truss structure.

Figure 4:
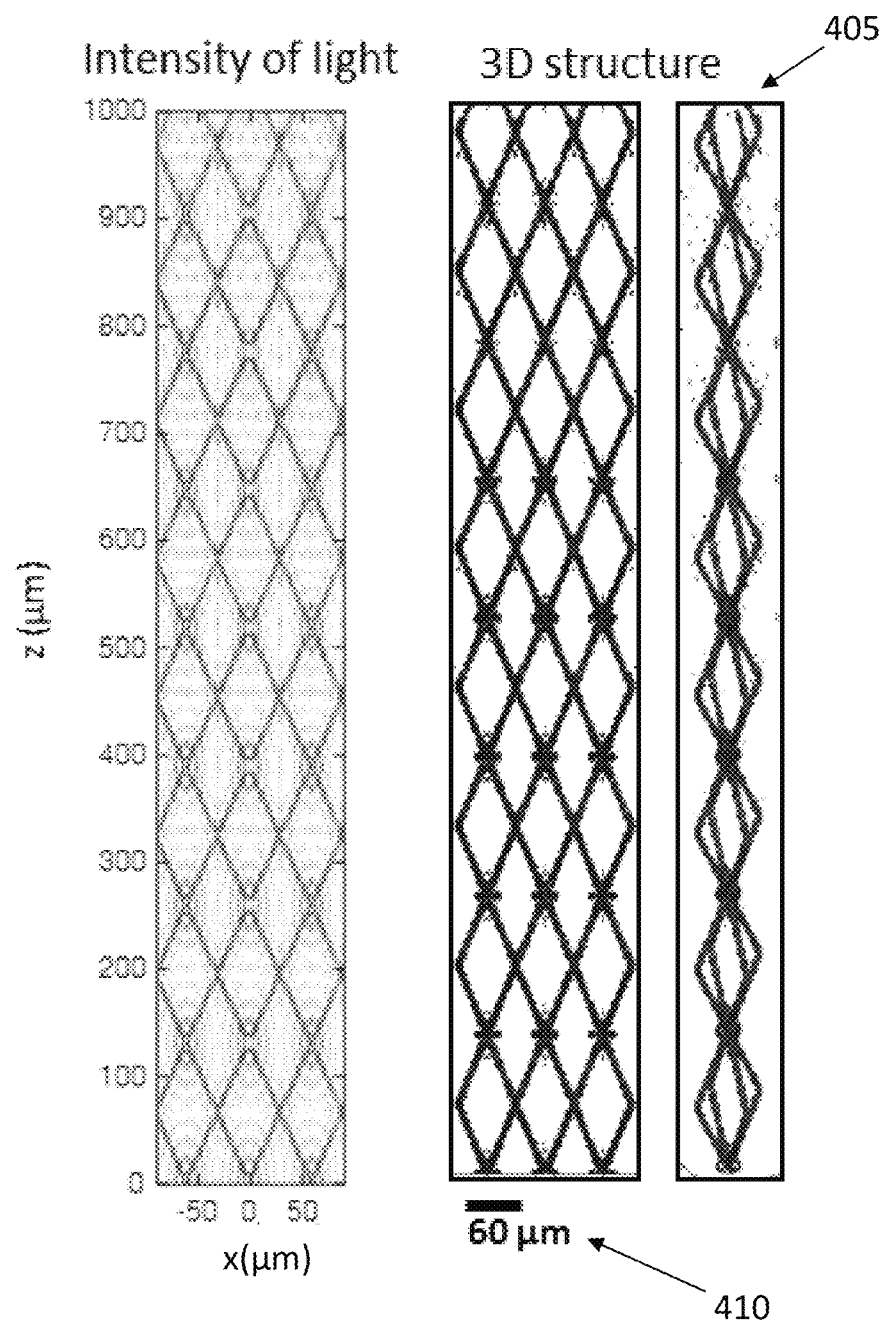
FIG. 4 illustrates the intensity of light generated by the structure of FIG. 2, along with the 3D structure formed in the photoresist by using this intensity pattern for photolithography.

FIG. 4 illustrates the simulated distribution of the light intensity in the axial plane under normal illumination with a single wavelength source at 532 nm. As a result, the input beam is shaped into a 3D micro-truss structure (405). This mesoscale 3D beam shaping is not limited to the intersection of some straight beams, as it is also possible to intersect curved beams in 3D. FIG. 4 illustrates simulated light intensity in the x-z axial plane. The same pattern will be generated in the y-z axial plane, which results in the formation of the 3D micro-truss shape. The structure is periodic in the x-y plane. However, only three periods of the structure are shown in FIG. 4 for simplicity. FIG. 4 illustrates the 3D micro-truss structure that will be formed in a polymer photoresist. The scale bar (410) is 60 micrometers.

Figure 5:
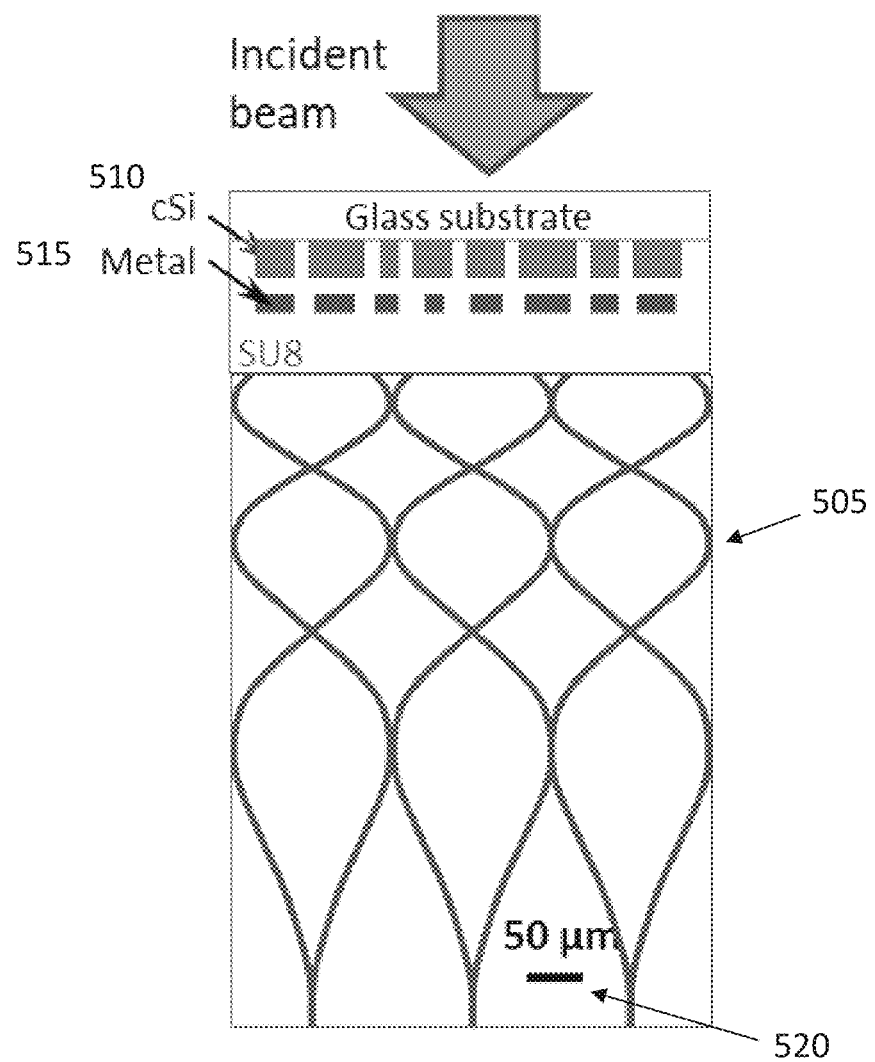
FIG. 5 illustrates a two layer metasurface device used as a mask to shape the beam to form curved lines.

It is also possible to design a metasurface mask to shape the incident beam like intersecting 3D curved lines. FIG. 5 illustrates a two layer metasurface (510,515) device designed to shape a 532 nm wavelength beam into curved lines (505). The scale bar (250) is 50 micrometers.

Figure 6:
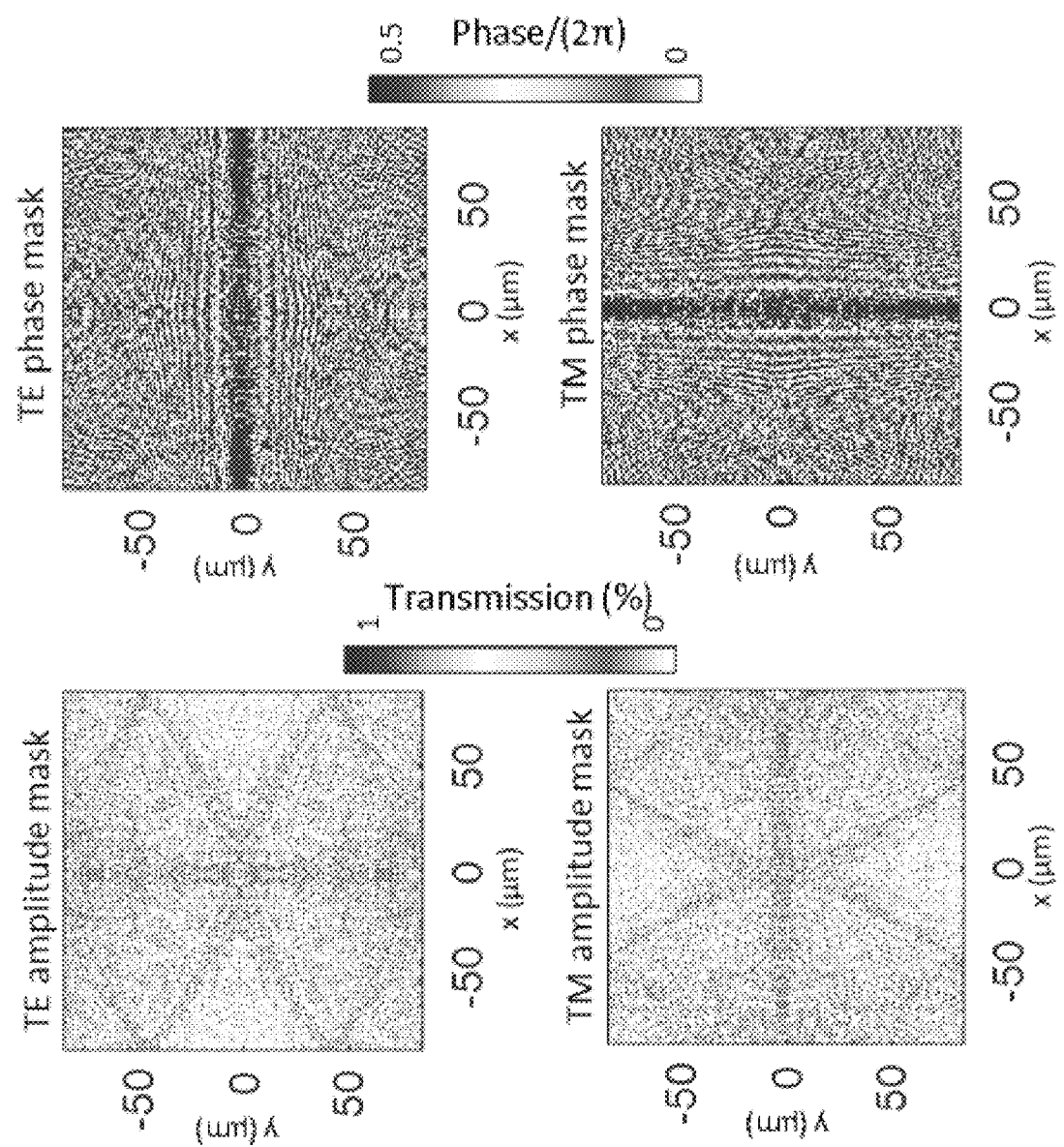
FIG. 6 illustrates the required amplitude and phase masks for TE and TM light polarizations for the structure of FIG. 5.
Figure 7:
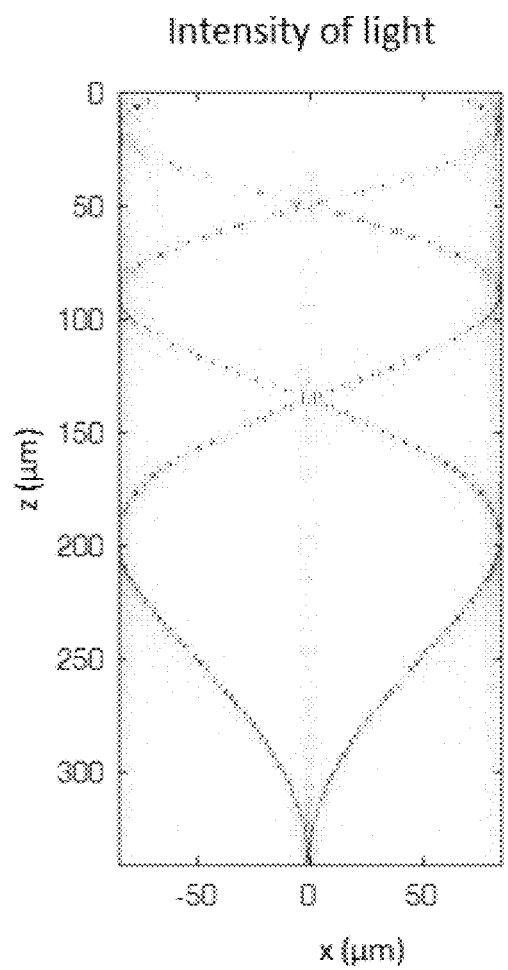
FIG. 7 illustrates the intensity of light generated by the structure of FIG. 5.

The designed amplitude and phase masks for two orthogonal polarizations (TE,TM) are shown in FIG. 6 (to generate the configuration of FIG. 5). Although only one period of the masks is shown for simplicity, they are assumed to be periodic in the x-y plane, resulting in 3D beam structures periodic in the x-y plane. One period of the final 3D curved beams in x-z axial plane is shown in FIG. 7. The metasurface is designed so that the structure has a 90° rotation symmetry, with the structure being similar in x-z and y-z cuts.

FIG. 7 illustrates the intensity of light in the axial x-z plane generated by the normal illumination of 532 nm light on the designed metasurface mask. The structure has 90° rotational symmetry. For simplicity, only one period of the structure in the x-y plane is shown in the graph, while the actual structure is periodic in this plane. The required amplitude and phase masks for both examples of FIGS. 2 and 5 can be calculated using various iterative and non-iterative methods, including but not limited to back propagation of point sources or a generalized volumetric Gerchberg-Saxton algorithm. In one implementation of the back propagation method, each solid point on the structure can be treated as a point source for light. The light emitted out of all these points is then back propagated to the metasurface layer, where they interfere and form the required amplitude and phase distribution on the metasurface. In another implementation of the back propagation method, a uniform light intensity (i.e., a plane wave) is back propagated through the structure of interest, whereby at each cross section, the solid points on the structure are treated as blocking masks and other points are transmissive. The amplitude and phase distribution on the metasurface are then calculated as one minus the complex electric field value that reaches the metasurface plane after back propagation. The Gerchberg-Saxton algorithm is an iterative algorithm for retrieving the phase of a pair of light distributions related via a propagating function, such as the Fourier transform, if their intensities at their respective optical planes are known.

FIG. 8 illustrates how 3D beams can also be shaped in nano and microscale feature sizes to generate new patterns not feasible with devices known in the art. For instance, the periodic 3D diamond lattice (810) is a complicated structure, which has not been demonstrated through mask-assisted beam shaping before. The periodic 3D diamond structure (810) can be shaped in a volume using a single metasurface (805), for example made of Si. FIG. 8 illustrates a single-layer metasurface with simultaneous control of phase and polarization that can be designed to shape the beam like a diamond lattice. A zoomed-in view of the lattice is also illustrated (815). The metasurface is made of amorphous silicon and is designed for operation under a 1064 nm wavelength source. The scale bar (820) is 2 micrometers. FIG. 8 illustrates a schematic illustration of the metasurface mask with simultaneous control of polarization and phase. A 3D diamond structure is defined in a specific medium under normal illumination with light at 1064 nm wavelength. A single unit cell (815) of the final 3D beam structure is shown. A scaled-down version of the structure, made from crystalline silicon, can be used to form a scaled version of the diamond lattice at a wavelength of 532 nm.

Two different phases that the metasurface is designed to impose at two different polarizations (TE and TM polarizations) are shown in FIG. 9. FIG. 9 illustrates one period of the designed phase masks for different polarizations. A single metasurface is designed to implement these corresponding phase masks. In the simulations, a normally incident plane wave at the 1064 nm wavelength was used as excitation. The intensity squared of the beam simulated using the finite difference time domain (FDTD) method is shown in FIG. 10. To design the dielectric metasurface, the methods reported in Arbabi, al. "Dielectric metasurfaces for complete control of phase and polarization with subwavelength spatial resolution and high transmission." Nature nanotechnology 10.11 (2015): 937-943, that are based on building libraries of nano-posts with different transmission phases for two orthogonal polarizations, can be used. The disclosure of Arbabi et al. (2015) is incorporated herein by reference in its entirety. The resulting structure can be further optimized to better reconstruct the desired beam shapes using full-wave simulation of a whole single period of the metasurface when applicable.

It is also possible to shape a 3D beam inside a photo-activated resist to form the diamond lattice structure in the resist, and therefore directly use the metasurfaces for 3D fabrication. FIG. 10 shows the final 3D diamond structure (1005) shaped in the resist, as an example, which resembles a diamond lattice. The structure (1005) has a wavelength-scale lattice and exemplifies the capability of the method described herein to fabricate nano-scale structures. FDTD simulation results of the designed metasurface under normal illumination of 1064 nm light are illustrated in FIG. 10.

FIG. 11 illustrates exemplary 3D structures that can be realized with the metasurfaces of the present disclosure. As described above, 3D interference lithography of submicron and mesoscale structures can be realized using metasurface-assisted interference lithography. As known to the person of ordinary skill in the art, there exist two methods for 3D interference lithography. The first method is multi-beam interference, where multiple coherent light beams are generated from the same source, routed through a table-top optical setup, and combined inside a photoresist to form the required interference pattern. While this method is very powerful, it is very hard to implement, very unstable, and in general extremely hard to take beyond laboratory research demonstrations.

The second method, mask assisted interference lithography, uses a diffractive mask that is either fabricated on the photoresist surface, or is in some other way brought into contact with the photoresist. The problem with current mask assisted lithography is that the level of control on the generated diffracted beams inside the photoresist is very limited, and the diffraction efficiencies are very small. In addition, designing a mask for a specific application is difficult, as the design usually comes down to a brute-force optimization of the mask structure with not much place for intuition. Metasurface-assisted 3D lithography, as described in the present disclosure, can overcome all of these problems, as it enables control of the diffraction orders with high efficiency and many degrees of freedom, including the polarization, phase, and amplitude. This can help fabricate structures such as the diamond lattice structure (1105) or gyroid structure (1110) of FIG. 11, which have not been possible to fabricate with conventional mask assisted lithography. Metasurface assisted lithography can also be used to form structures at the mesoscale.

In some embodiments, the first step to carry out is choosing the target structure. For example, the first step may be to choose a structure such as the diamond (1105) of FIG. 11. Once the structure is chosen, the method comprises additional steps to determine the phase masks that will generate the chosen structure, and subsequently the metasurface scatterers that will generate the calculated phase masks. In some cases, there may be several configurations or types of scatterers that can generate the phase mask. Any one of these configurations may be selected.

When the target unit cell is chosen, the propagating diffraction orders can be found using the equation $nk_0 > |G_{pm}|$, where n is the refractive index of the photoresist, $k_0$ is the free space propagation constant of light, and $G_{pm}$ is the inverse lattice vector determined by indices p and m. The inverse lattice vectors depend on the exact lattice structure chosen, but for example, for a square lattice with lattice constant 1, the inverse lattice vector lengths are $|G_{pm}| = 2\pi/l \sqrt{p^2 + m^2}$. The electric field on the metasurface mask can be written as a summation of the diffraction orders as in Eq. 1, below.

If the metasurface has unity transmission (i.e., it controls only the phase), the phase provided by the metasurface can be written as the phase of this field distribution (Eq. 2, below). Using a planar electric field distribution with this phase and a unit amplitude, the respective amplitudes and phases of different orders ($A_{pm}$ and $\phi_{pm}$) can be optimized using different optimization techniques like the genetic algorithm, so that the resulting volumetric intensity distribution is as close as possible to the target structure. Since the specific algorithm used is not critical to the other steps of the method, the present disclosure does not describe this algorithm step in further details, as it will be understood by the person of ordinary skill in the art.

The volumetric intensity can be calculated using various methods such as the plane wave propagation method, which calculate the electric and magnetic fields resulting from the propagation of an electric field distribution on a surface. The resulting phase distribution, ϕ), should be implemented using the metasurface. For some applications, such as interference lithography, the important point about the final volumetric intensity distribution is which parts of the space have an intensity higher than a given threshold. In lithography, this threshold determines which parts of the photoresist volume are in fact exposed and will not be developed. Depending on many parameters related to the photoresist or exact exposure and development procedures, this threshold value varies, but normal values range from 0.2 to 0.6. Based on this value, in most examples in the present disclosure the final 3D intensity distribution is shown as a binary structure, which refers to whether the intensity in a specific location is above or below the threshold. In addition, it is this binary version that is compared to the desired structure in the optimization process. In other words, the optimization routines reduce the difference between the desired structure, and the binarized intensity distribution.

The following equations are used during the optimization method:

$$E = \sum_{p,m} A_{pm} e^{j\varphi_{pm}} e^{j\frac{2\pi}{T}px} e^{j\frac{2\pi}{T}my} \quad (1)$$

$$\varphi = \angle \sum_{p,m} A_{pm} e^{j\varphi_{pm}} e^{j\frac{2\pi}{T}px} e^{j\frac{2\pi}{T}my} \quad (2)$$

Equation (1) shows the superposition of multiple diffraction orders of a metasurface with a unit cell size of l in both x and y directions, and Equation (2) shows the phase of this electric field on the metasurface plane. The metasurfaces with the ability to control phase can implement this phase mask. In addition, for metasurfaces that control phase and polarization, there are two sets of equations similar to (1) and (2), each governing one of the two orthogonal polarizations that the metasurface independently controls.

Figure 12:
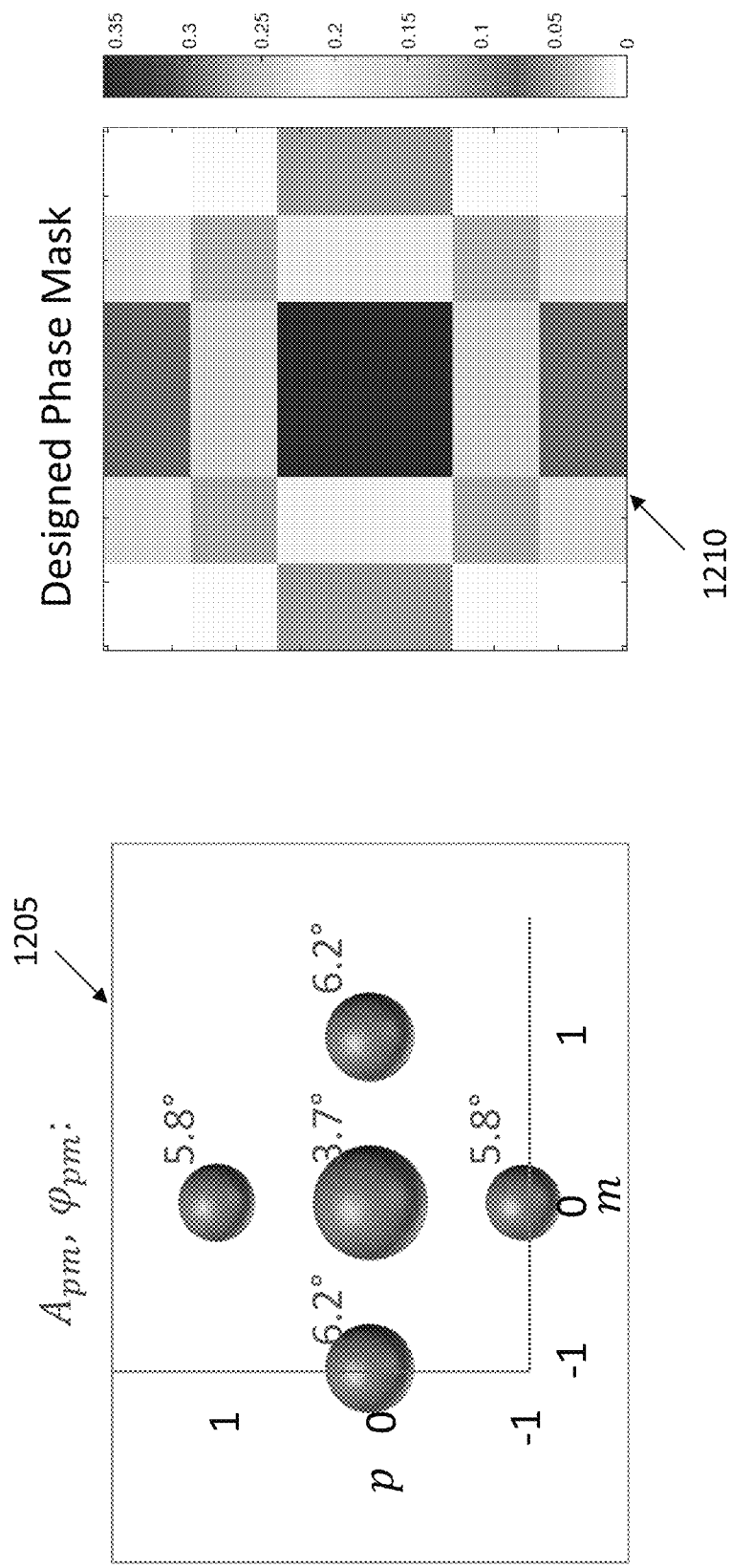
FIG. 12 illustrates the relative amplitudes and phases of 5 diffraction orders of a metasurface phase mask.

FIG. 13 illustrates an example of a target unit cell of a structure (1305), as well as a designed unit cell (1310). The design process is described above, applying Eqs. (1) and (2), as illustrated also by FIG. 12. FIG. 12 illustrates examples of amplitude (1205) and phase (1210) as determined for the structure of FIG. 13. In FIG. 12, the size of each circle in graph (1205) denotes the relative amplitude of $A_{pm}$ for that diffraction order. The angle written by each circle denotes the corresponding phase, $\phi_{pm}$. FIG. 12 illustrates the relative amplitudes and phases (1205) of the 5 diffraction orders of a metasurface phase mask with a period of about 337 nm in both x and y directions that creates the intensity distribution shown in (1310). The size of the spheres on each point corresponds to the relative amplitude of that order, and the phase written above the orders denotes the corresponding phase. The corresponding phase mask (1210) is illustrated as well.

For more complicated structures, such as the diamond lattice, the metasurface can control the phase independently for the two orthogonal polarizations of the beam going through the metasurface. The initial design process for such structures is similar to that of the previous example of FIGS. 12-13, with the difference that there are now two independent sets of amplitude and phase coefficients for the two polarizations. In these cases, one additional degree of freedom in the design is the state of the polarization of the input beam, as it sets the ratio of the amplitudes for the x-polarized and y-polarized parts of the field. As a result, this input polarization should be included in the design routine used to optimize the diffraction order amplitudes and phases such that the similarity between the binarized simulated intensity distribution and the target intensity distribution is maximized. After these phase masks for the two polarizations are calculated, the initial design of the metasurface is carried out using a built library of nano-posts that implement these phases for the two polarizations (see FIG. 19). Using this initial design, the metasurface structure is further optimized through a full-wave simulation process.

Figure 14:
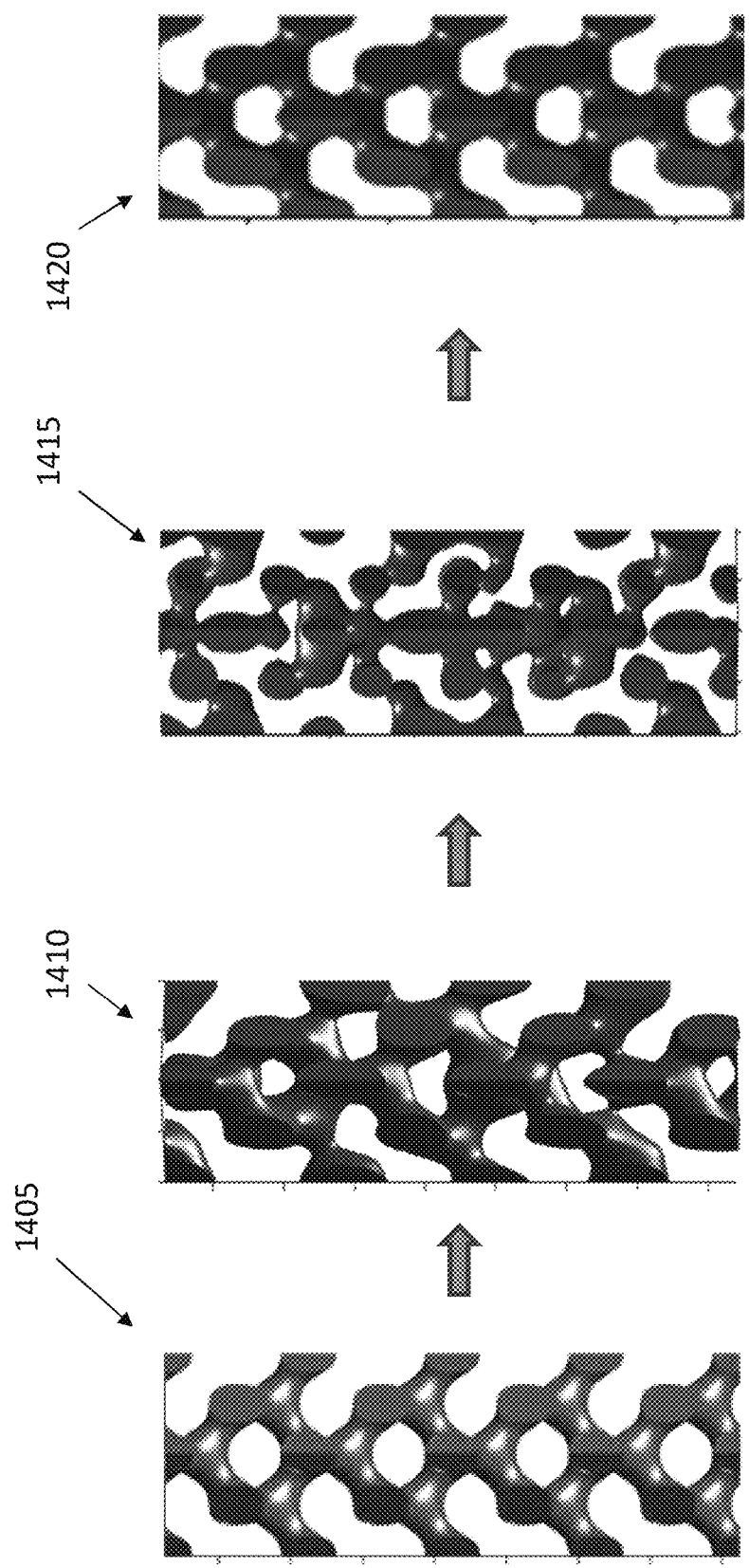
FIG. 14 illustrates the example of a diamond lattice structure.
Figure 15:
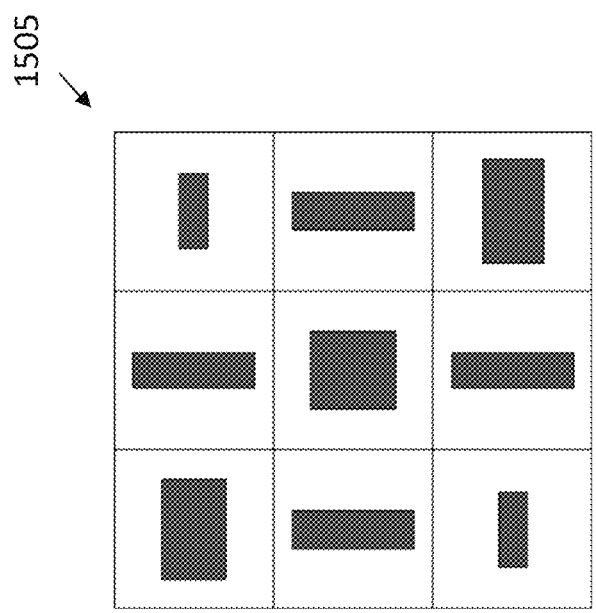
FIG. 15 illustrates the top view of the unit cell of the metasurface that generates the intensity distribution shown in FIG. 14.

In this step, one period of the metasurface is simulated in its entirety using periodic boundary conditions and an appropriate simulation technique such as FDTD, FEM, FDFD, RCWA, or others, which are known to the person of ordinary skill in the art. From the simulation, the electric field distribution after the beam exits the metasurface can be extracted, and the volumetric intensity distribution can be calculated from this electric field distribution using methods such as plane wave expansion. The sizes and shapes of the nano-posts can then be tuned using various methods such as the gradient descent or adjoint and topological optimization techniques to render the resulting volumetric 3D intensity distribution more similar to the desired distribution. That is, the similarity between the binarized 3D intensity distribution resulting from full-wave simulation of the metasurface and the target 3D structure is maximized. An optimized structure, where the tuned parameters are the lateral dimensions of the nano-posts, is shown in FIGS. 14-15 along with its final corresponding volumetric intensity. The metasurface structure is in fact optimized to decrease the difference between the target lattice and the binarized volumetric intensity resulting from the full wave simulation of the metasurface.

FIG. 14 illustrates the target diamond lattice (1405), the structure obtained after optimizing the phase masks (1410), the structure obtained after the phase masks are implemented with nanoposts and full wave simulation (1415), and the structure after the nanoposts are optimized with full wave simulation (1420), according to the method explained above. FIG. 15 illustrates a top view of the nanoposts (1505) with reference to (1420).

Figure 17:
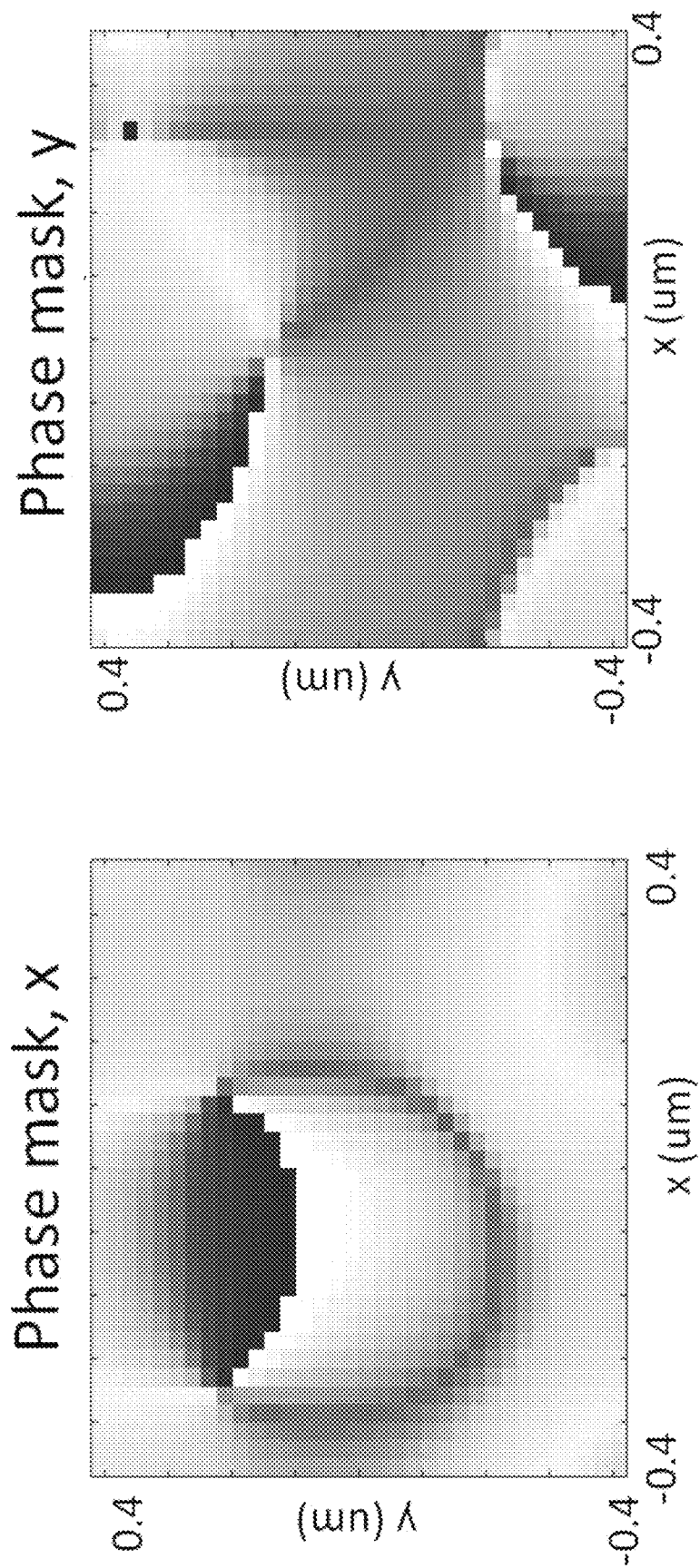
FIG. 17 illustrates the designed phase masks for the TE and TM polarizations for a metasurface that generates the intensity distribution of the gyroid structure shown in FIG. 18.
Figure 18:
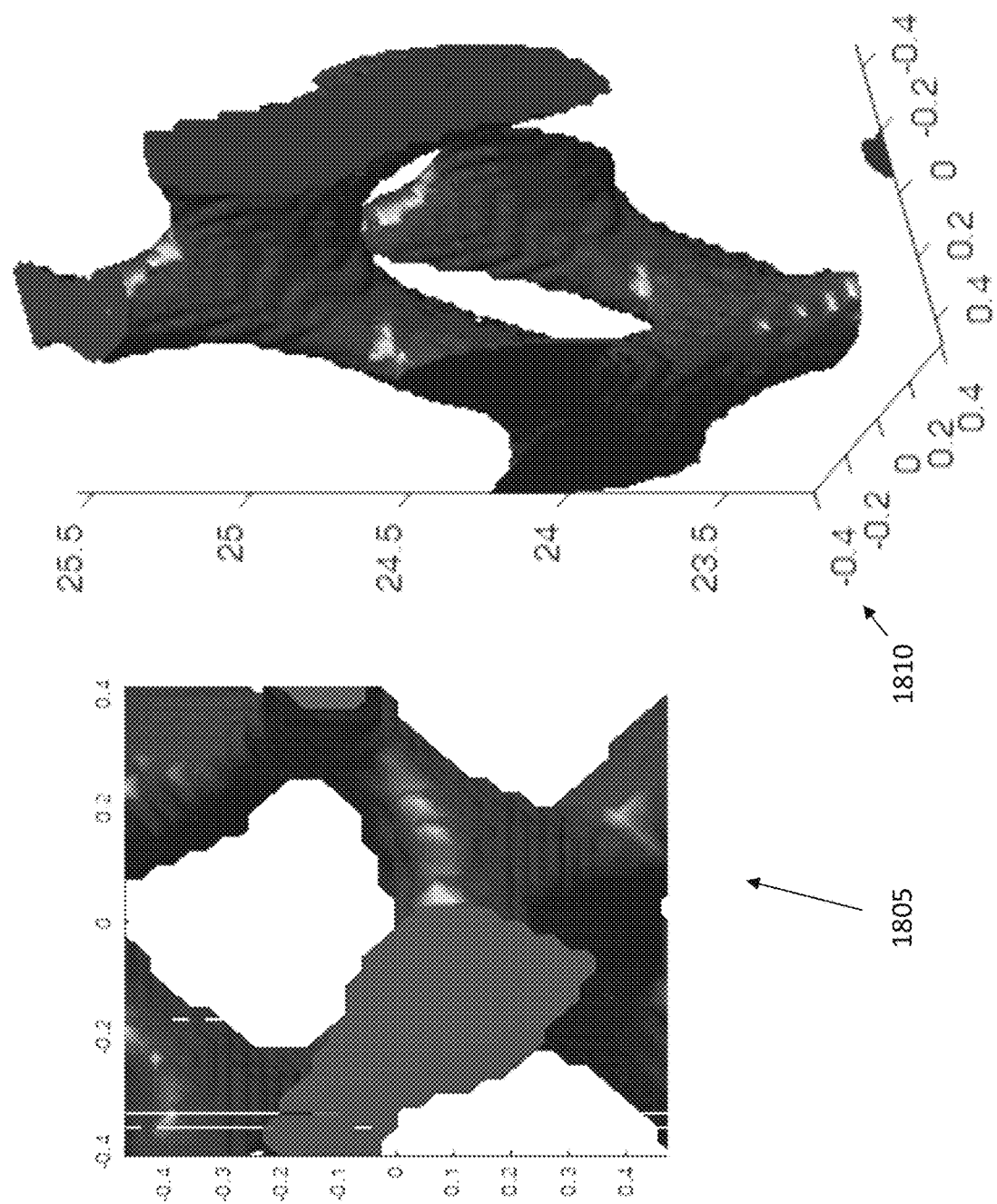
FIG. 18 shows the binarized intensity distribution of the gyroid structure generated using the phase masks shown in FIG. 17.

Using the techniques explained above, other structures like the gyroid lattice structure can also be formed. FIG. 16 illustrates the target gyroid structure (1605) with also a top view (1610). The resulting designed phase masks for the x and y polarized light are shown in FIG. 17. Using these phase masks, the initial nano-post structures can be found using the library based method explained below. The rest of the design and optimization steps are similar to the ones of the previous examples. FIG. 18 illustrates the final structure (1810) and a top view of such structure (1805).

The metasurface platform based on the dielectric birefringent nano-posts can independently control the phase for any two input orthogonal polarizations. For instance, the nano-posts shown in FIG. 19 are designed for an operational wavelength of 850 nm. The nanoposts form a lattice that has a lattice constant of 480 nm. The nanoposts in this example are 650 nm tall, and are made of amorphous silicon on a transparent substrate such as glass. By changing the dimensions a and b of the nano-post (panel a), the transmission phase of the light polarized along the two axes, $\phi_x$ and $\phi_y$, is tuned (panel b). These transmission phases are calculated using the simulation of a periodic array of nano-posts with the same dimensions with normally incident light of wavelength 850 nm, and polarized along both x and y polarizations. Using the phase versus dimension graphs, it is possible to calculate the nano-post dimensions required to provide a specific pair of phase values, $\phi_x$ and $\phi_y$, as shown in panel c. This method allows designing a metasurface that controls x and y polarized light independently. With a simple generalization, the same can be done for any two linear orthogonal polarizations, simply by rotating the nano-posts to match the new polarization axes. Therefore, the phases required to obtain a target structure allow choosing the initial nanopost dimensions as in FIG. 19. The dimensions of the nanoposts can subsequently be optimized to render the resulting structure closer to the target structure.

Figure 20:
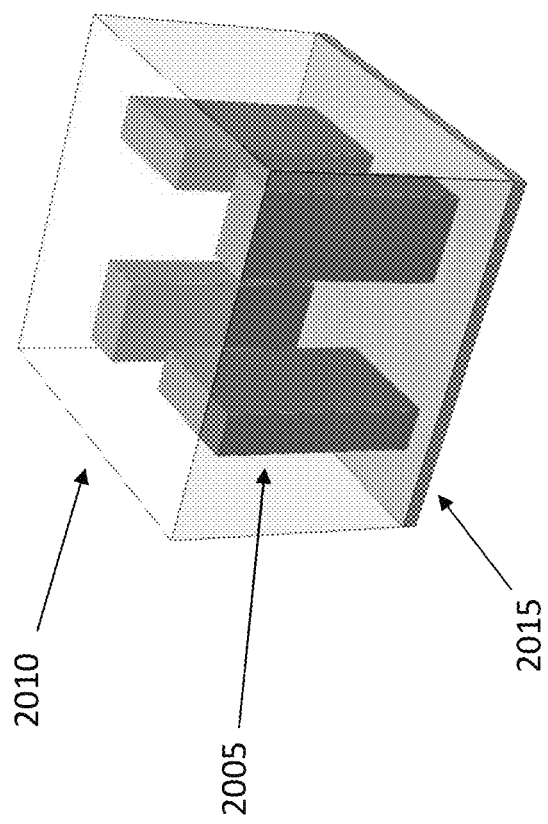
FIG. 20 shows the metasurface unit cell designed to generate the intensity distribution shown in FIG. 14.

FIG. 20 illustrates exemplary nanoposts that can be used in the metasurface to generate the structure of FIG. 8. In this example, the metasurface unit cell is optimized to form the diamond lattice inside the photoresist SU8 at a wavelength of 532 nm. The lattice excites 9 diffraction orders as it has a lattice constant of 500 nm. The metasurface is made of crystalline silicon nano-posts (2005) that are 290 nm tall. The nano-posts are on a transparent glass substrate (2015), and are capped with a layer of baked SU8 polymer (2010) about 2 micrometers thick. The SU8 layer both acts as a mechanical protection layer that keeps the nano-posts safe, and as an index matching layer that keeps the required diffraction orders propagating right above the nano-posts, and as such can be replaced with any other materials that serves both purposes. An additional index matching liquid, such as glycerol, can be used between the capped metasurface, and the photoresist that is to be exposed with the 3D intensity pattern. This index matching layer serves to remove the potential air gap between the capped metasurface and the photoresist to be exposed, and as such should have a refractive index as close as possible to the capping layer and the photoresist. In this example, a binarizing threshold of 0.55 is used to draw the final structure that is expected to be exposed inside the resist. In addition, the incident wave polarization is linear, with a ratio of 0.45 to 1 for the electric field amplitudes along x and y axis. For a different optimized structure, the optimized polarization state might also be different.

Figure 21:
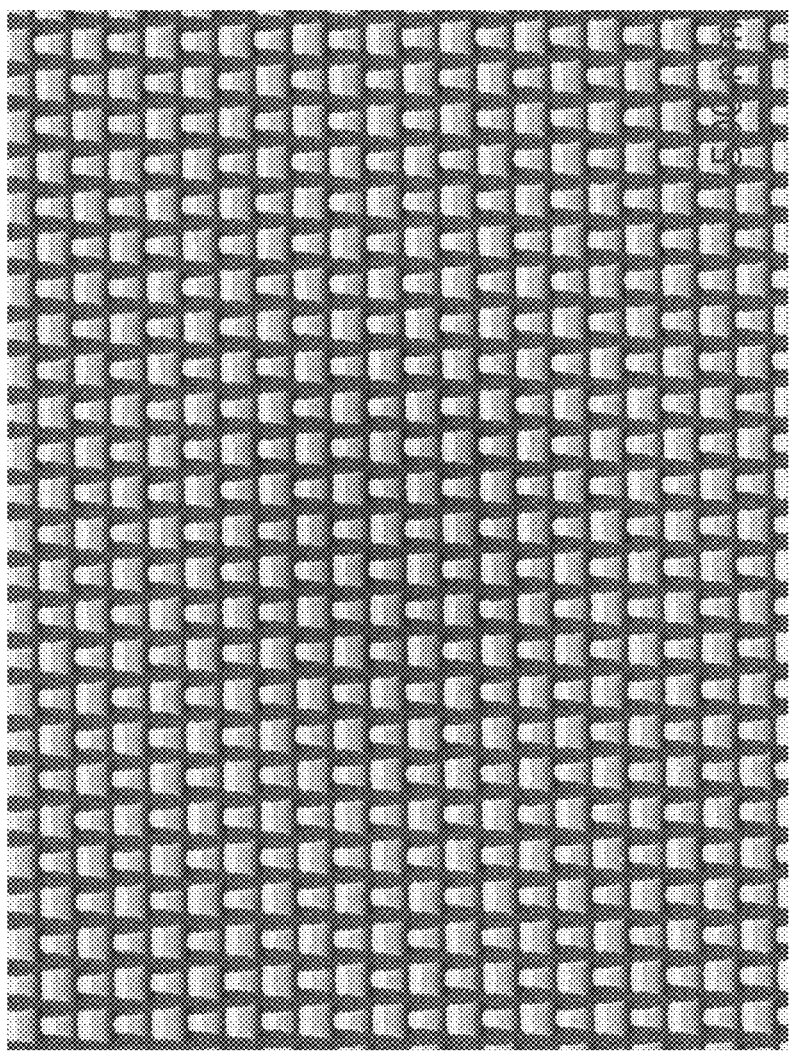
FIGS. 21 and 22 show scanning electron micrographs of the fabricated metasurface composed of unit cells shown in FIG. 20.
Figure 22:
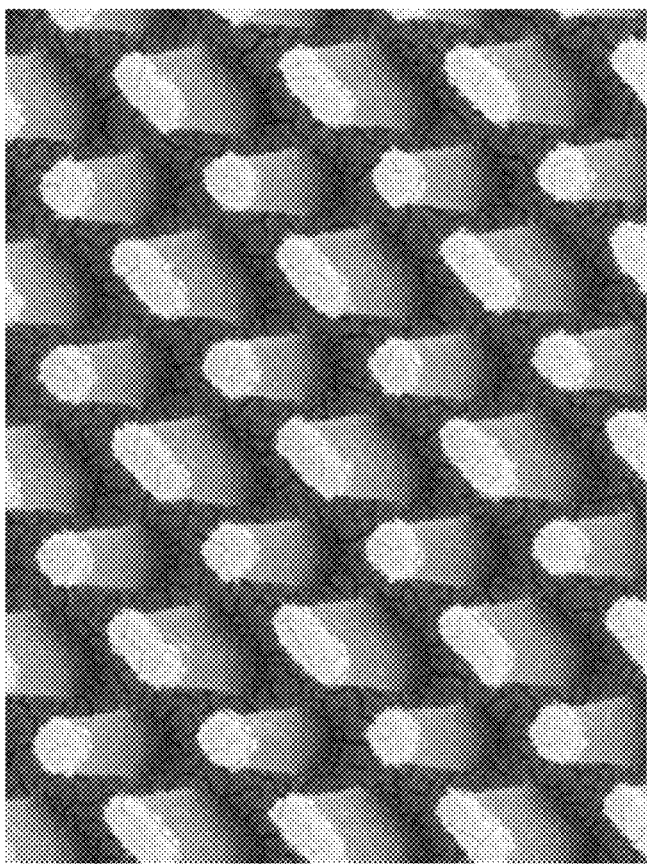
Figure 22:
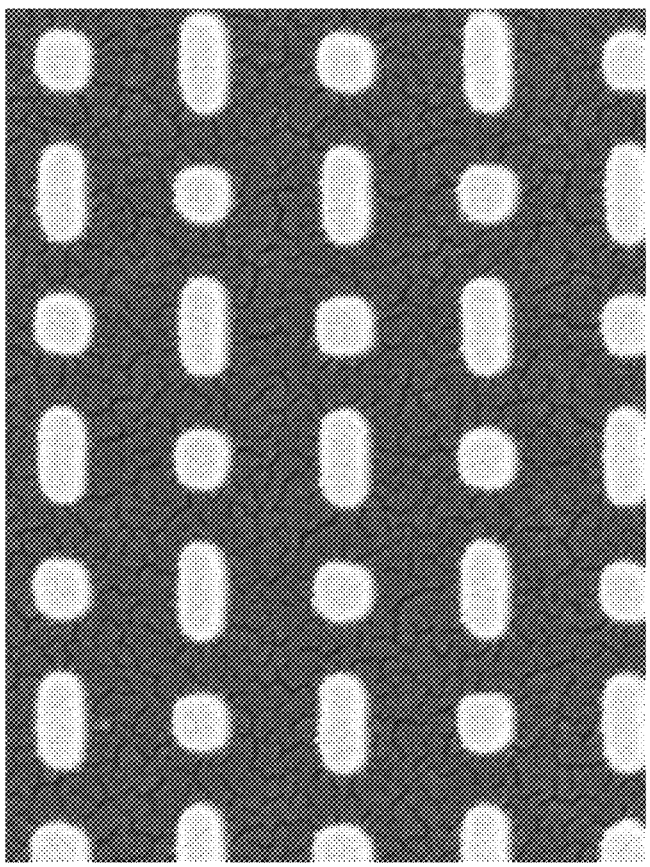
Figure 23:
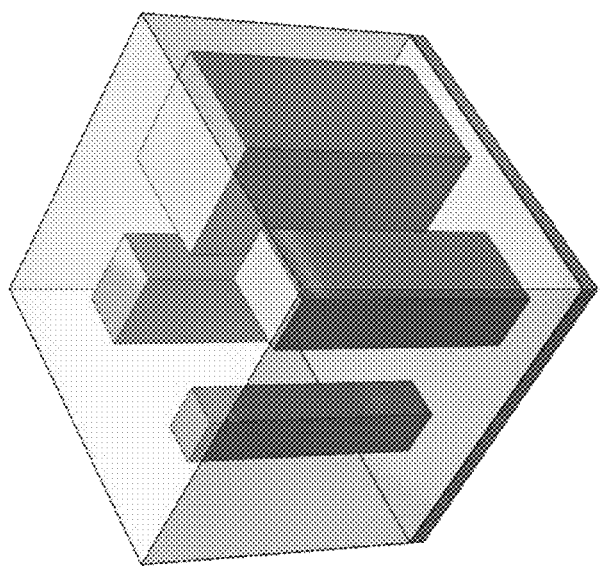
FIG. 23 illustrates an exemplary metasurface unit cell that generates the intensity distribution shown in FIG. 24.
Figure 24:
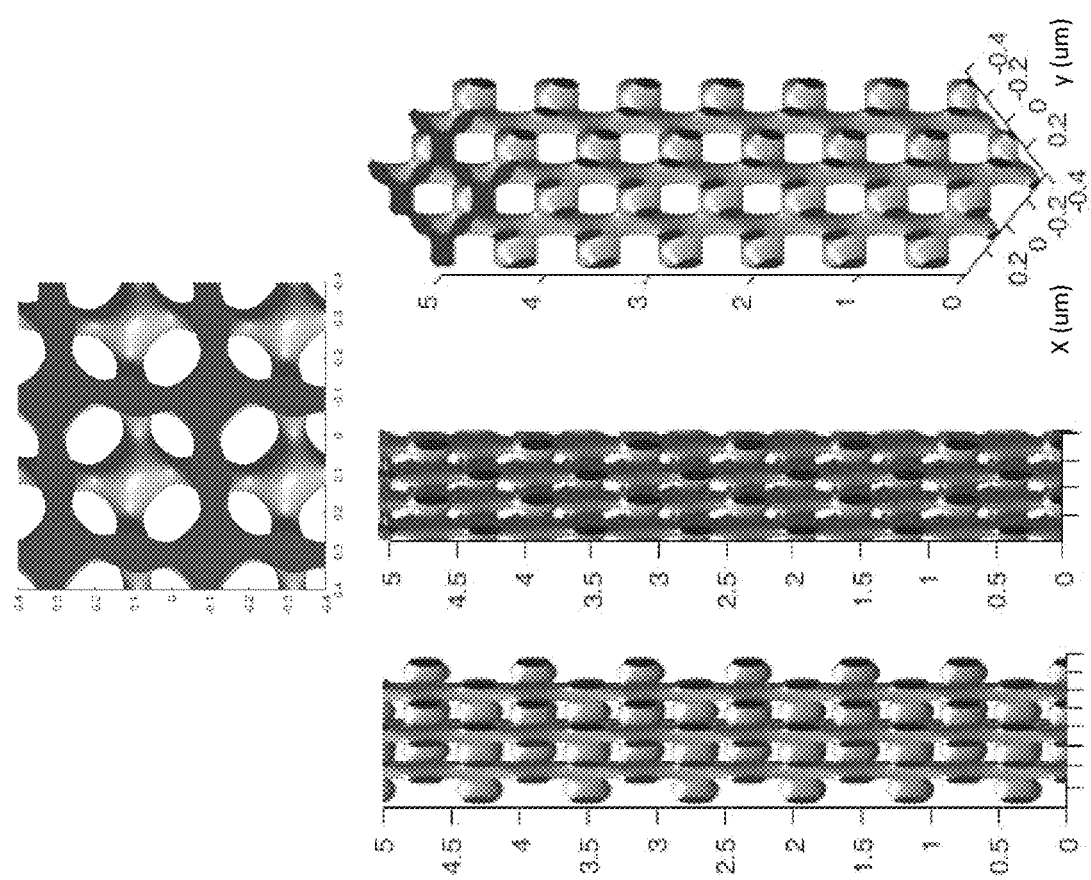
FIG. 24 illustrates the binarized intensity distribution generated by the metasurface unit cell shown in FIG. 23.
Figure 25:
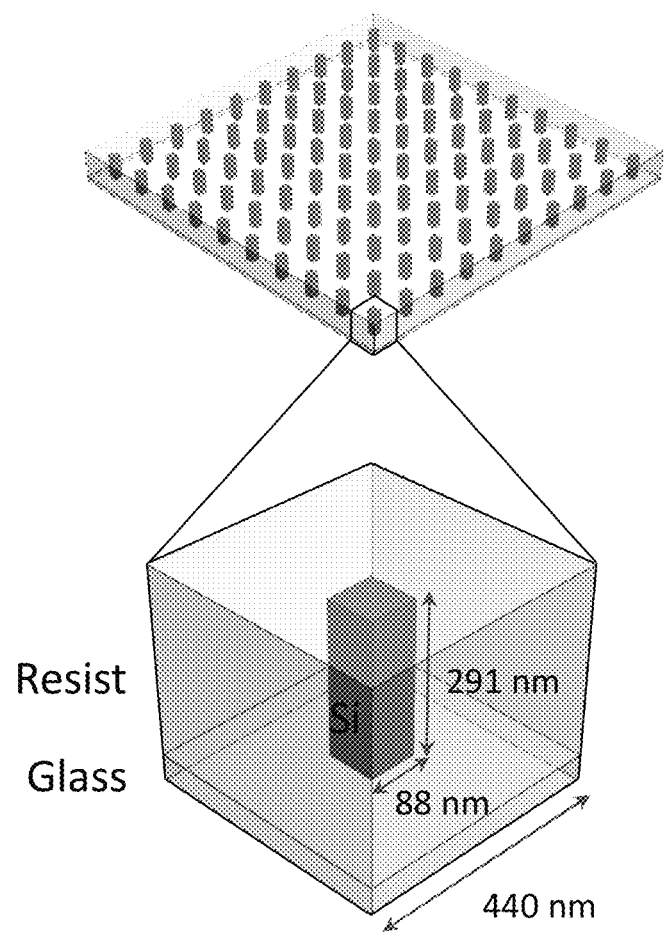
FIG. 25 illustrates an exemplary metasurface unit cell that generates the intensity distribution of the structure shown in FIG. 26.
Figure 26:
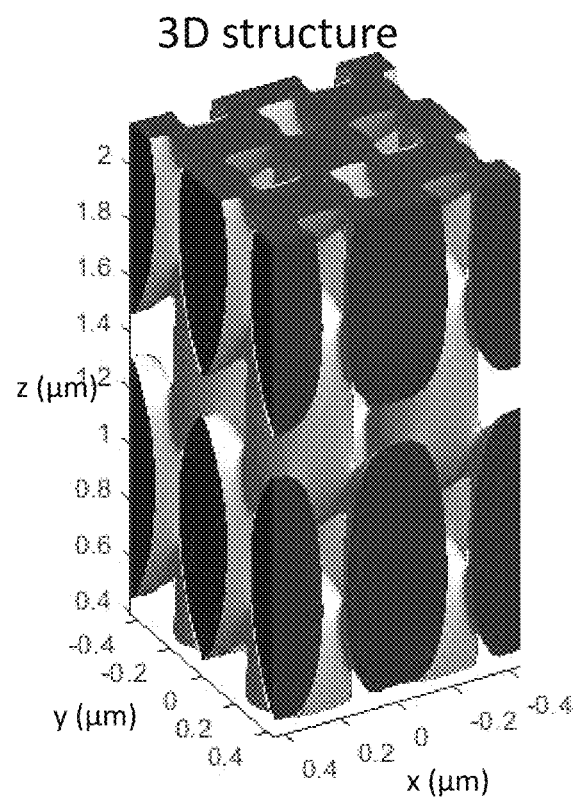
FIG. 26 illustrates the binarized intensity distribution generated by the metasurface unit cell shown in FIG. 25.

FIG. 21 illustrates an exemplary metasurface with differently shaped and oriented nanoposts, and a scale bar of 500 nm. The exemplary fabricated metasurface mask for 3D interference lithography is capped with a SU8 layer. Multiple metasurfaces can be fabricated together that are either designed to generate the same 3D intensity pattern, or to generate different intensity patterns. FIG. 22 illustrates a top view (2205) and a perspective view (2210) of the structure of FIG. 21. FIG. 23 illustrates another exemplary unit cell of a metasurface that is designed in the manner explained in previous examples to generate the structure shown in FIG. 24. FIG. 25 illustrates an exemplary metasurface with a single nanopost as unit cell, generating the structure of FIG. 26.

Figure 27:
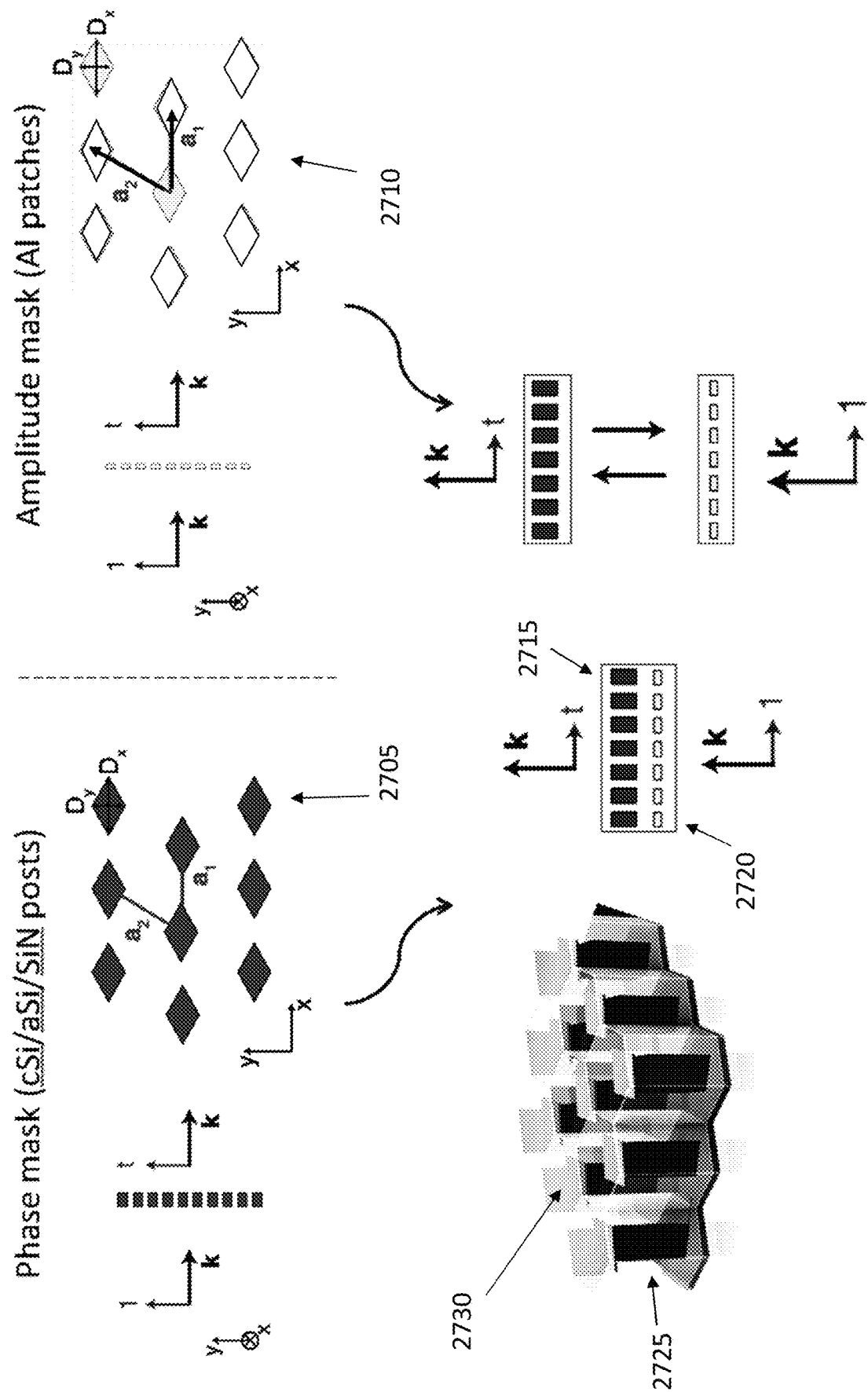
FIG. 27 illustrates the structure of an exemplary double-layer metasurface structure formed from a dielectric layer, and a metallic layer that provide control over the transmission phase and amplitude of light independently for the two orthogonal linear polarizations.

FIG. 27 illustrates phase, amplitude and polarization control. In this example, a double-layer metasurface can be designed and used to control amplitude and phase independently for the two orthogonal linear polarizations. The metasurface consists of a dielectric layer that can be made of various materials based on the wavelength. For instance, titanium dioxide, silicon nitride, and crystalline silicon can be used for visible light, amorphous silicon can be used for red, near, and mid-IR light. The dielectric nano-posts are on a transparent glass substrate like glass, and capped with a transparent polymer like SU8. The nano-posts shown here have diamond shaped cross sections (2705). They work similarly to the ones described in FIG. 19, with the difference that the two diagonals $D_x$ and $D_y$ are tuned in order to cover the whole $2\pi$ phase range for the two polarizations. Other nano-post shapes such as elliptical or rectangular can be used as well. The asymmetry of the nano-posts (i.e., the use of elliptical instead of circular, or rectangular instead of square and so on) is necessary when independent phase control over the polarizations is required.

The second layer of the metasurface of FIG. 27 is composed of metallic nano-scatterers of different shapes. The examples shown here have diamond shape cross sections. Similar to the phase control with the dielectric nano-posts, the dimensions of the metallic scatterer ($D_x$ and $D_y$) can be independently controlled in order to control the transmission for the two linear orthogonal polarizations independently. The metallic metasurface layer is formed from these metallic scatterers, typically in the 50 nm-200 nm range of thickness (that can be shaped in different shapes with at least two controllable dimensions, e.g., elliptical, rectangular, diamond, etc.) that are on a lattice similar to or different than that of the dielectric metasurface. The metallic nano-scatterers are patterned on top of the polymer layer capping the dielectric metasurface. Their patterns can be generated using photolithography, electron-beam, or nano-imprint lithography depending on their dimensions, or the number of fabricated samples (i.e., photolithography and nano-imprint for large scale high volume fabrications). A second capping polymer layer can be used to cover the metallic scatterers to provide mechanical support and stability, and also work as an index matching layer, similar to the case of single layer metasurfaces. In a different embodiment, the metallic metasurface layer might be fabricated on the transparent glass substrate first. The metallic metasurface is then capped with a first polymer layer (like SU8). The dielectric metasurface is deposited and patterned on top of the first capping layer. Finally, a second capping layer can be used to cap the dielectric metasurface. FIG. 27 illustrates therefore a double layer metasurface, comprising a metallic metasurface (2720), and a dielectric metasurface (2715). A perspective view of the double layer metasurface is also shown, illustrating the dielectric scatterers (2725) and the metallic scatterers (2730).

The design process of the whole structure goes as follows: First, the transmission matrices for various dimensions of the dielectric and metallic scatterers of a chosen shape are calculated. For example, the transmission and reflection amplitudes of a uniform layer of diamond shaped dielectric and metallic layer, for various values of $D_x$ and $D_y$ are calculated. The total transmission phase and amplitude can then be estimated by cascading the individual transmission matrices of the two layers using the transfer matrix method, or other similar methods. Once this step is completed, the transmission amplitude and phase for any combination of a dielectric nano-post and metallic scatterer in the built library is estimated. The final combinations can then be chosen as the dielectric nano-post/metallic scatterer pair that has transmission amplitudes and phases for the two polarizations that best matches the required values right above them. Moreover, the chosen pair can be further optimized using a full-wave simulation that includes both the dielectric and metallic scatterers. The simulation will calculate the total transmission amplitude and phase through both layers, and can use periodic boundary conditions on the sides of the unit cell to decrease simulation times. Then, the shapes and sizes of the two scatterers (i.e., dielectric and metallic) are tuned in order to minimize the difference between the achieved transmission phase and amplitude and the desired values. Various optimization techniques like gradient descent or adjoint methods can be used in order to change the shape parameters to achieve a lower error (i.e., difference between simulated and desired transmissions). For this general design process to work exactly as explained, the two metallic and dielectric metasurface layers should have the same underlying lattices (similarly as shown in FIG. 27), and the two layers should be aligned in the fabrication process. Therefore, the two lattices for the metallic metasurface and the dielectric metasurface are matching.

FIG. 13 illustrates the target binarized intensity distribution (1305) for an exemplary micron-scale periodic lattice that can be formed using a single layer dielectric metasurface with the ability to control the phase of light passing through it. In addition, FIG. 13 illustrates the periodic structure resulting from the binarized intensity distribution (1310) achieved from the combination of diffraction orders of the phase mask described in FIG. 12, that is designed to have the maximum similarity to the target distribution of (1305).

FIG. 14 illustrates the example of a desired diamond lattice structure (1405), along with resulting binarized intensity distribution in middle design steps (1410, 1415), and the final binarized intensity distribution (1420). FIG. 15 illustrates the top view of the unit cell of the metasurface that generates the intensity distribution shown in (1420). The metasurface is made of amorphous silicon nano-posts on a glass substrate and capped by an SU8 layer. Each side of the shown unit cell is 921 nm, the nano-posts are 1000 nm tall, and the light has a wavelength of 1064 nm. FIG. 16 illustrates side and top views of the unit cells of an exemplary gyroid lattice structure that can be generated using a single layer metasurface with the ability to control the phase independently for TE and TM polarizations.

FIG. 17 illustrates the designed phase masks for the TE and TM polarizations for a metasurface that generates the intensity distribution of the gyroid structure shown in FIG. 18. FIG. 18 shows the binarized intensity distribution of the gyroid structure generated using the phase masks shown in FIG. 17. FIG. 19 shows an exemplary nano-posts structure for a metasurface, in addition to simulated transmission phases versus the side widths, and the chosen side widths to provide a desired phase pair for x- and y-polarized light. FIG. 20 shows the metasurface unit cell designed to generate the intensity distribution shown in (1420). The metasurface excites nine diffraction orders as it has a lattice constant of 500 nm. The metasurface is made of crystalline silicon nano-posts that are 290 nm tall. The nano-posts are on a transparent glass substrate, and are capped with a layer of baked SU8 polymer about 2 µm thick. This process can be extended to include more dielectric or metallic layers in order to enable more precise control of the phase and amplitude, or enable control of phase at multiple wavelengths or angles. For instance, two dielectric layers with different dimensions and/or shapes of the nano-posts can be used to control the phases at two difference wavelengths. In this case, the total transmission will be a function of both nano-post dimensions at both wavelengths, and this provides enough control parameters to independently control the phases at the two wavelengths of light. The multiple dielectric layers can be made from similar or different materials.

The design of the metallic scatterers is in principle very similar to the design of the dielectric metasurface nano-posts. FIG. 28 illustrates the choice of the initial metallic scatterer dimensions based on the required amplitudes. A periodic array of metallic scatterers is simulated, and the transmission amplitudes and phases are calculated. Periodic boundary conditions can be used in the simulations. Based on the exact design, the metallic scatterers can be on a transparent substrate (e.g., glass, SU8, etc.) and capped with air, or completely immersed inside a transparent material (e.g., SU8 or glass). The simulations should be run for various lateral dimensions of the scatterers (i.e., different $D_x$ and $D_y$ values, while keeping the thickness constant). The simulation results are then summarized in tables that give the transmission amplitude versus scatterer dimensions (2805). Using the data in the graphs of FIG. 28 (2805), the values of $D_x$ and $D_y$ can be chosen to provide any pair of desired transmission amplitudes, |Ex| and |Ey|, as shown in (2810).

In some embodiments, the cascaded metasurfaces are arranged as a structure comprising: one or more metasurfaces, each metasurface of the one or more metasurfaces comprising an array of scatterers on a substrate, the array of scatterers configured to control a phase, an amplitude, and a polarization of scattered electromagnetic waves. The array of scatterers of each metasurface of the one or more metasurfaces comprises metallic scatterers or dielectric scatterers, and the array of scatterers of each metasurface of the one or more metasurfaces has a parametric shape determined by a plurality of dimensional parameters. In some embodiments, the plurality of dimensional parameters comprises: a height, a first lateral dimension, and a second lateral dimension, the second lateral dimension being shorter than the first lateral dimension. In some embodiments, the parametric shape is a pillar having a cross-section selected from the group consisting of: rectangular, elliptical, diamond, and trigonal.

In some embodiments, the one or more metasurfaces comprise a plurality of metasurfaces, and metasurfaces of the plurality of metasurfaces are cascaded in a sequence adjacently to each other. In some embodiments, the array of scatterers is configured to control the phase, the amplitude, and the polarization of the scattered electromagnetic waves with subwavelength spatial resolution. In some embodiments, the dielectric scatterers are made of silicon, gallium phosphide, silicon nitride, or titanium dioxide.

In some embodiments, a method to design cascaded metasurfaces comprises: selecting a desired three dimensional (3D) shape of an electromagnetic beam, comprising a desired phase, a desired amplitude, and a desired polarization; selecting a parametric shape for an array of scatterers for each metasurface of one or more metasurfaces; calculating, by a computer, a simulated 3D shape of a simulated electromagnetic beam scattered by the one or more metasurfaces; calculating a difference between the desired 3D shape and the simulated 3D shape; iterating steps b)-d) until a threshold minimum value for the difference is achieved; and fabricating the one or more metasurfaces based on the parametric shape, once the threshold minimum value for the difference is achieved. In some embodiments, selecting the parametric shape comprises selecting a height, a first lateral dimension, and a second lateral dimension, the second lateral dimension being shorter than the first lateral dimension. In some embodiments, the desired 3D shape is a periodic 3D shape, and the method comprises: defining the desired amplitude within a unit cell of the periodic 3D shape; and periodically copying the periodic 3D shape to form a Bravais lattice structure.

In some embodiments, the method comprises defining a normalized intensity above a threshold value over a volume with a finite cross-section around vertices and sides of the Bravais lattice structure. In some embodiments, the threshold value of the normalized intensity is greater than 0.5 or greater than 0.4. In some embodiments, the one or more metasurfaces comprise a plurality of metasurfaces, and the method comprises: selecting a different parametric shape for each metasurface of the plurality of metasurfaces; cascading each metasurface of the plurality of metasurfaces to form a metasurface device. In some embodiments, the parametric shape of adjacent metasurfaces is the same in shape but may have different size, as visible in FIG. 27. In some embodiments, the plurality of metasurfaces comprises a first metasurface comprising dielectric scatterers, and a second metasurface comprising metallic scatterers. In some embodiments, the array of dielectric scatterers and the array of metallic scatterers have a matching periodic lattice.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

What is claimed is:

1. A method comprising:
    a) selecting a desired three dimensional (3D) shape of an electromagnetic beam, comprising a desired phase, a desired amplitude, and a desired polarization;
    b) selecting a parametric shape for an array of scatterers for each metasurface of one or more metasurfaces;
    c) calculating, by a computer, a simulated 3D shape of a simulated electromagnetic beam scattered by the one or more metasurfaces;
    d) calculating a difference between the desired 3D shape and the simulated 3D shape;
    e) iterating steps b)-d) until a threshold minimum value for the difference is achieved; and
    f) fabricating the one or more metasurfaces based on the parametric shape, once the threshold minimum value for the difference is achieved;
        wherein the desired 3D shape is a periodic 3D shape, and step a) comprises:
        a1) defining the desired amplitude within a unit cell of the periodic 3D shape; and
        a2) periodically copying the periodic 3D shape to form a Bravais lattice structure.

2. The method of claim 1, wherein:
    selecting the parametric shape comprises selecting a height, a first lateral dimension, and a second lateral dimension, the second lateral dimension being shorter than the first lateral dimension.

3. The method of claim 1, wherein the one or more metasurfaces comprise a plurality of metasurfaces, and step b) comprises:
    g) selecting a different parametric shape for each metasurface of the plurality of metasurfaces; and
    h) cascading each metasurface of the plurality of metasurfaces to form a metasurface device.

4. The method of claim 1, wherein steps a1)-a2) comprise:
    defining a normalized intensity above a threshold value over a volume with a finite cross-section around vertices and sides of the Bravais lattice structure.

5. The method of claim 4, wherein the threshold value of the normalized intensity is greater than 0.5.

6. A method comprising:
    a) selecting a desired three dimensional (3D) shape of an electromagnetic beam, comprising a desired phase, a desired amplitude, and a desired polarization;
    b) selecting a parametric shape for an array of scatterers for each metasurface of a plurality of metasurfaces;
    c) calculating, by a computer, a simulated 3D shape of a simulated electromagnetic beam scattered by the plurality of metasurfaces;
    d) calculating a difference between the desired 3D shape and the simulated 3D shape;
    e) iterating steps b)-d) until a threshold minimum value for the difference is achieved; and
    f) fabricating the plurality of metasurfaces based on the parametric shape, once the threshold minimum value for the difference is achieved;
        wherein the plurality of metasurfaces comprises a first metasurface comprising dielectric scatterers, and a second metasurface comprising metallic scatterers.

7. The method of claim 6, wherein the array of dielectric scatterers and the array of metallic scatterers have a matching periodic lattice.

8. The method of claim 6, wherein:
    selecting the parametric shape comprises selecting a height, a first lateral dimension, and a second lateral dimension, the second lateral dimension being shorter than the first lateral dimension.

9. The method of claim 6, wherein the one or more metasurfaces comprise a plurality of metasurfaces, and step b) comprises:
    i) selecting a different parametric shape for each metasurface of the plurality of metasurfaces; and
    j) cascading each metasurface of the plurality of metasurfaces to form a metasurface device.

* * * * *